United States Patent
Tanaka et al.

(10) Patent No.: US 7,062,334 B2
(45) Date of Patent: Jun. 13, 2006

(54) POSITIONING CONTROL METHOD, POSITIONING CONTROL DEVICE, AND ELECTRONIC COMPONENT MOUNTING APPARATUS USING SAME

(75) Inventors: Yoichi Tanaka, Yamanashi (JP); Takahiro Kurokawa, Kofu (JP); Seiichi Matsuo, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 367 days.

(21) Appl. No.: 10/181,198

(22) PCT Filed: Jan. 16, 2001

(86) PCT No.: PCT/JP01/00214

§ 371 (c)(1),
(2), (4) Date: Jul. 15, 2002

(87) PCT Pub. No.: WO01/54469

PCT Pub. Date: Jul. 26, 2001

(65) Prior Publication Data

US 2003/0009260 A1 Jan. 9, 2003

(30) Foreign Application Priority Data

Jan. 17, 2000 (JP) ............................ 2000-008023
Jan. 12, 2001 (JP) ............................ 2001-005334

(51) Int. Cl.
*G05B 11/32* (2006.01)

(52) U.S. Cl. ............................ 700/69; 700/28; 700/29; 700/32; 700/33; 700/38; 700/39; 700/245; 700/177; 700/184; 700/186; 700/193; 700/90

(58) Field of Classification Search ............ 700/28–29, 700/32–33, 38–39, 69, 245, 177, 184, 186, 700/253, 188, 193, 90; 318/560, 618, 625, 318/632, 565; 901/9

See application file for complete search history.

(56) References Cited

U.S. PATENT DOCUMENTS 4,415,967 A * 11/1983 Russell .................... 700/186
4,565,950 A    1/1986 Kikuno
4,600,985 A    7/1986 Nozawa et al.

(Continued)

FOREIGN PATENT DOCUMENTS

JP          63-5408         1/1988

(Continued)

*Primary Examiner*—Anthony Knight
*Assistant Examiner*—Thomas Pham
(74) *Attorney, Agent, or Firm*—Wenderoth, Lind & Ponack, L.L.P.

(57) ABSTRACT

There are provided a positioning control method and a positioning control device, which enables high speed positioning with low power consumption without repeating two or more acceleration and deceleration operations during travel from an original position to a target position. There is also provided an electronic component mounting apparatus, which enables high speed positioning with low power consumption and enables mounting of electronic components in a short period of time. When a movable body is moved from the original position to the target position, there is set an operational passing position for avoiding a passing avoidance region, and driving of a drive unit having a smaller travel distance from the original position to a coordinate of the operational passing position is started later than driving start timing of a drive unit having a longer travel distance, from the original position to another coordinate of the operational passing position, by a specified period of time.

21 Claims, 27 Drawing Sheets

U.S. PATENT DOCUMENTS

| | | | | |
|---|---|---|---|---|
| 4,706,204 A | * | 11/1987 | Hattori | 700/262 |
| 4,712,052 A | * | 12/1987 | Omae et al. | 318/625 |
| 5,025,362 A | | 6/1991 | Darlington et al. | |
| 5,331,542 A | * | 7/1994 | Itoh | 700/63 |
| 5,530,791 A | | 6/1996 | Okabayashi | |
| 5,610,489 A | * | 3/1997 | Hart et al. | 318/571 |
| 5,886,494 A | * | 3/1999 | Prentice et al. | 318/625 |
| 5,923,132 A | | 7/1999 | Boyer | |
| 5,924,192 A | * | 7/1999 | Wuyts | 29/833 |
| 5,952,804 A | * | 9/1999 | Hamamura et al. | 318/560 |
| 6,022,132 A | * | 2/2000 | Schulz | 700/186 |
| 6,097,168 A | * | 8/2000 | Katoh et al. | 318/568.11 |
| 6,128,546 A | * | 10/2000 | Basista et al. | 700/166 |

FOREIGN PATENT DOCUMENTS

| | | |
|---|---|---|
| JP | 5-11843 | 1/1993 |
| JP | 5-127718 | 5/1993 |

\* cited by examiner

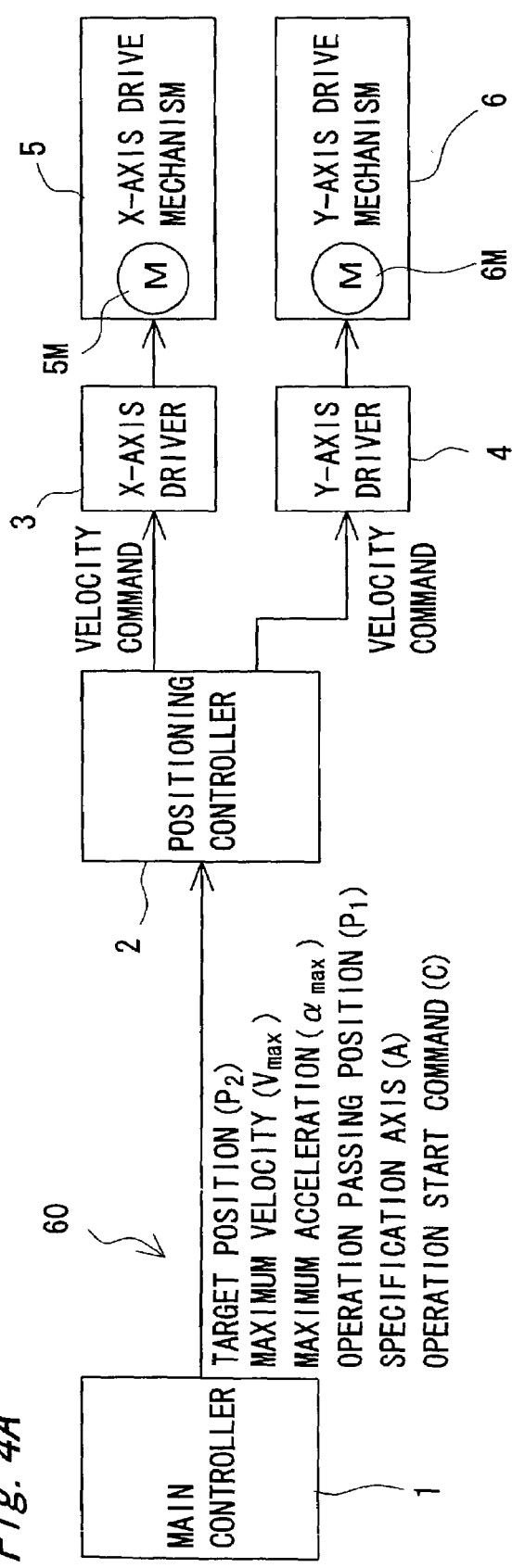
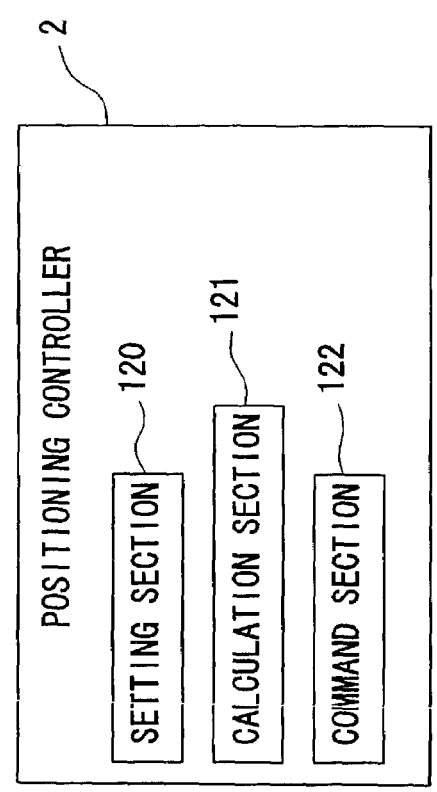
Fig. 4A
Fig. 4B

Fig. 9

CASE OF CONSTANT ACCELERATION CURVE

| | | |
|---|---|---|
| Sa≦Sb | $\dfrac{V^2}{2\alpha} \leqq Sa$ | $t = \dfrac{V}{\alpha} + \dfrac{Sa - \dfrac{V^2}{2\alpha}}{V}$ ... (1) |
| | $\dfrac{V^2}{2\alpha} > Sa$ | $t = \sqrt{\dfrac{2Sa}{\alpha}}$ ... (2) |
| Sa>Sb | $\dfrac{V^2}{2\alpha} \leqq Sb$ | $t = \dfrac{V}{\alpha} + \dfrac{Sa - \dfrac{V^2}{2\alpha}}{V}$ ... (3) |
| | $\dfrac{V^2}{2\alpha} > Sb,$ AND $\dfrac{V^2}{\alpha} > S$ | $t = 2\sqrt{\dfrac{S}{\alpha}} - \sqrt{\dfrac{2Sb}{\alpha}}$ ... (4) |
| | $\dfrac{V^2}{2\alpha} > Sb,$ AND $\dfrac{V^2}{\alpha} \leqq S$ | $t = \dfrac{2V}{\alpha} + \dfrac{S - \dfrac{V^2}{\alpha}}{V} - \sqrt{\dfrac{2Sb}{\alpha}}$ ... (5) |

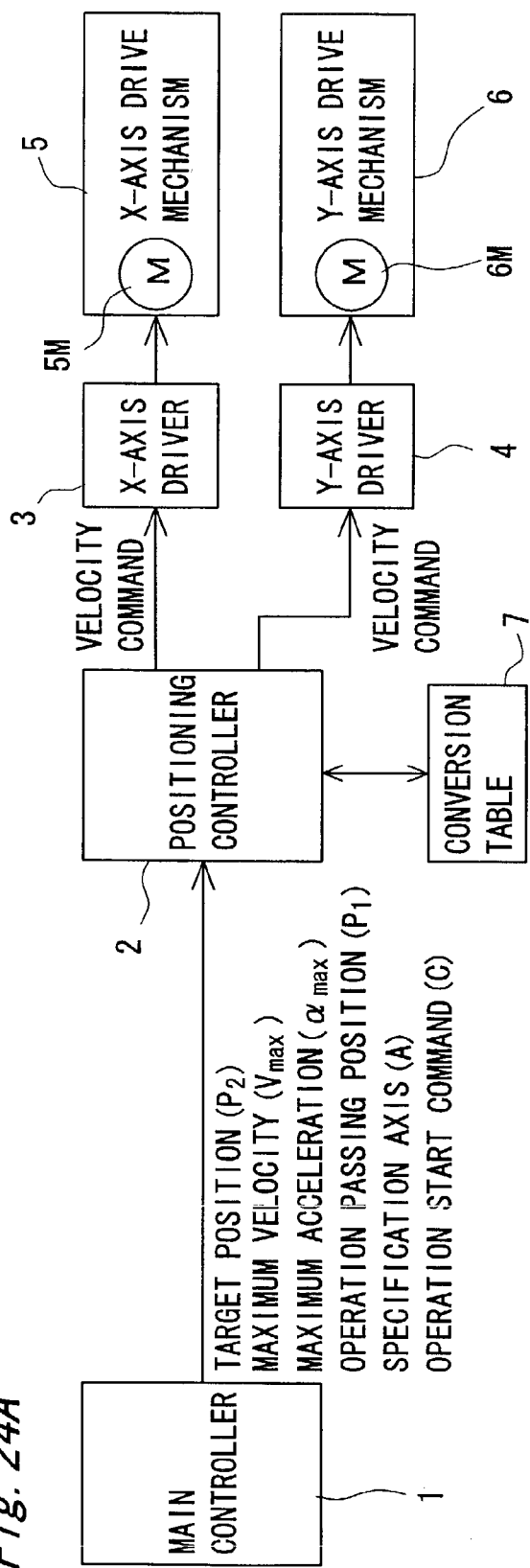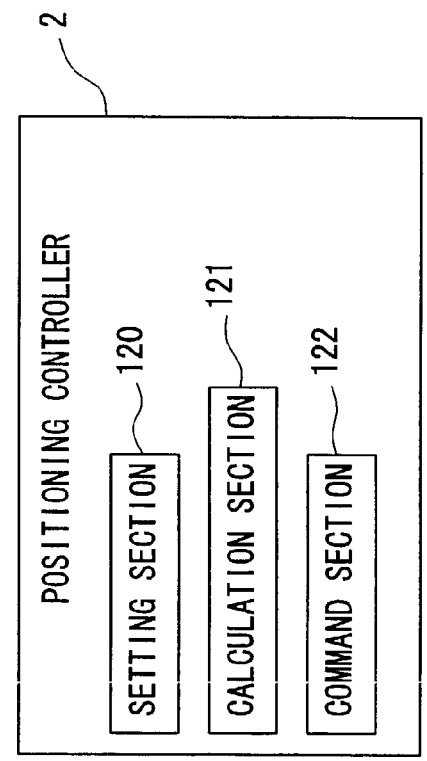

Fig. 26

CASE OF ARBITRARY ACCELERATION CURVE

| | | |
|---|---|---|
| Sa ≦ Sb | RaS ≦ Sa | $t = RaN + \dfrac{Sa - RaS}{V}$ ... (6) |
| | RaS > Sa | $t = RaN \cdot Tbl\left[\dfrac{Sa}{RaS}\right]$ ... (7) |
| Sa > Sb | RdS ≦ Sb | $t = RaN + \dfrac{Sa - RaS}{V}$ ... (8) |
| | RdS > Sb AND RaS + RdS > S | $t = (RaN + RdN) \cdot Tbl\left[\dfrac{Sa}{RaS - RdS}\right]$ $- RdN \cdot Tbl\left[\dfrac{Sb}{RdS}\right]$ ... (9) |
| | RdS > Sb AND RaS + RdS ≦ S | $t = RaN + RdN + \dfrac{S - RaS - RdS}{V}$ $- RdN \cdot Tbl\left[\dfrac{Sb}{RdS}\right]$ ... (10) |

POSITIONING CONTROL METHOD, POSITIONING CONTROL DEVICE, AND ELECTRONIC COMPONENT MOUNTING APPARATUS USING SAME

This application is a National Stage application of PCT/JP01/00214, filed Jan. 16, 2001.

TECHNICAL FIELD

The present invention relates to a positioning control method, a positioning control device, and an electronic component mounting apparatus using the same. More specifically, the present invention relates to a positioning control technique suitably applied to, for example, a case of controlling high speed positioning of a movable body with low power consumption while avoiding an impassable area with use of a plurality of actuators.

BACKGROUND ART

In an electronic component mounting apparatus, for example, there are driven a plurality of actuators 81 and 82 such as servomotors as shown in FIG. 32, and there is used a positioning control device 80 for controlling a position of a transfer head 85, that is an example of a movable body, with use of a ball screw and the like to move the transfer head 85 from an original position to an arbitrary target position. Here, from each parameter including a maximum velocity and a maximum acceleration, there is created a velocity change pattern, based on which the transfer head 85 is moved for implementation of positioning control.

Such conventional positioning control of a movable body is implemented by the positioning control device 80 composed of a mechanism portion mounting a positioning target or a transfer head 85, servomotors 81 and 82 for driving the mechanism portion, a main controller 90 for outputting a target position P2 for moving the transfer head 85 that exemplifies a movable body, a maximum velocity $V_{max}$ in movement, a maximum acceleration $\alpha_{max}$ in movement, and an operational start command C in movement, a positioning controller 91 for outputting a velocity command based on a given command, and servo drivers 92 and 93 for controlling drive of the servomotors 81 and 82 based on a given velocity command.

In the electronic component mounting apparatus incorporating the positioning control device 80, the transfer head 85 is positioned in an arbitrary position at planar coordinates with aid of a plurality of actuators 81 and 82 such as servomotors. For example, in moving the transfer head 85 from a planar coordinate $P_0$ (original position) to a planar coordinate $P_2$ (target position), if there is a region PAR that the transfer head 85 avoids passing in a linear travel route from the original position to the target position, positioning operation has been conducted by dividing the travel route into a route from the planar coordinate $P_0$ to an operational passing position $P_1$ and a route from the operational passing position $P_1$ to the target position $P_2$ as shown in FIGS. 32 and 33.

Herein, a travel distance between $P_0$–$P_1$ in X direction is referred to as $X_1$, a travel distance between $P_0$–$P_1$ in Y direction as $Y_1$, a travel distance between $P_1$–$P_2$ in X direction as $X_2$, and a travel distance between $P_1$–$P_2$ in Y direction as $Y_2$.

FIG. 34 shows a driving pattern of the transfer head 85 in this case. As shown in FIG. 34, each actuator such as a servomotor is tune-controlled so that timing of moving start and moving end between both $P_0$–$P_1$ and $P_1$–$P_2$ in X direction and Y direction is synchronous. In the route between $P_0$–$P_1$ where a travel amount in Y direction is large, movement in Y direction is implemented by driving with maximum acceleration $\alpha_{max}$ until a velocity reaches maximum velocity $V_{max}$, whereas movement in X direction is implemented at a slower speed of $V_{max} \times (X_1/Y_1)$. In the route between $P_1$–$P_2$ where a travel amount in X direction is large, movement in X direction is implemented by driving with maximum acceleration $\alpha_{max}$ until its velocity reaches the maximum velocity $V_{max}$, whereas movement in Y direction is controlled to be implemented at a slower speed of $V_{max} \times (Y_2/X_2)$. Consequently, driving is made in a state that movement of the transfer head 85 in either one direction is especially decelerated, resulting in longer driving time. Further, acceleration and deceleration operations conducted at the transfer passing position $P_1$ increase power consumption.

As other positioning methods, there has been employed a method for moving from the original position $P_0$ to the target position $P_2$ via a middle passing position $P_{1P}$, an operational passing position $P_1$, and a middle passing position $P_{2P}$ by independently controlling respective actuators such as servomotors in each route between $P_0$–$P_1$ and between $P_1$–$P_2$ without synchronizing timing of moving end in X direction and Y direction as shown in FIGS. 35 and 36. In this method, driving is made with maximum acceleration $\alpha_{max}$ from the original position $P_0$ to the middle passing position $P_{1P}$ both in X and Y direction until a velocity reaches maximum velocity $V_{max}$. For movement in further Y direction from $P_{1P}$ to $P_1$, driving is continuously made only in Y direction. At the operational passing position $P_1$, movement in both X and Y direction is temporarily stopped. Then, driving is made with the maximum acceleration $\alpha_{max}$ from $P_1$ to $P_{2P}$ both in X and Y direction until a velocity reaches the maximum velocity $V_{max}$. For movement in further X direction from $P_{2P}$ to $P_2$, driving is continuously made only in Y direction. Thus, control on movement to the target position $P_2$ is implemented. Therefore, a driving velocity can be a maximum velocity with use of the maximum acceleration in each moving operation in place of increased frequency of stop and start operations, as well as prolonged driving time and enlarged power consumption as with the case of the above-stated method.

In the above-stated prior art, there are performed, in each case, two or more acceleration and deceleration operations, or stop and start operations, during movement, which may inhibit achievement of a maximum moving velocity. This prolongs moving operation time of the movable body and increases power consumption for driving, thereby preventing implementation of higher speed and power saving. In addition, in the latter case, there is an issue of requiring an expensive positioning control device for individual control of a plurality of actuators.

Accordingly, for solving these conventional issues, it is a first object of the present invention to provide a positioning control method and a positioning control device, which enable high speed positioning with low power consumption without repeating two or more acceleration and deceleration operations during movement from an original position to a target position.

It is a second object of the present invention to provide an electronic component mounting apparatus which makes it possible to mount electronic components for a short period of time through high speed positioning with low power consumption.

SUMMARY OF THE INVENTION

In order to accomplish the above objects, the present invention has the following constitutions.

In accomplishing the above objects, according to a first aspect of the present invention, there is provided a positioning control method for controlling movement of a movable body from an original position to a target position by individually driving a plurality of drive units for moving the movable body in directions orthogonal to each other while avoiding passing of the movable body through a passing avoidance region, comprising:

setting an operational passing position that is a passing point in a travel route of the movable body for avoiding the passing avoidance region; and starting driving of a drive unit having a smaller travel distance from the original position to a coordinate of the operational passing position, later than driving start timing of a drive unit having a longer travel distance to another coordinate of the operational passing position.

According to a second aspect of the present invention, there is provided a positioning control method as defined in the first aspect, further comprising:

calculating necessary driving time for the travel distance in each drive direction for moving the movable body from the original position to the operational passing position; and starting driving of the drive unit having the smaller travel distance from the original position to its coordinate of the operational passing position, later than operation timing of the drive unit having the longer travel distance based on a calculated necessary driving time of each drive unit.

According to a third aspect of the present invention, there is provided a positioning control method as defined in the second aspect, further comprising starting driving of the drive unit having the smaller travel distance from the original position to its coordinate of the operational passing position, later than operation timing of the drive unit having the longer travel distance by a calculated difference of necessary times for driving these respective drive units.

In this positioning control method, driving start timing of the drive unit having the smaller travel distance from the original position to its coordinate of the operational passing position is delayed by a specified period of time from driving start time of the drive unit having the longer travel distance, which enables passing of the movable body through the operational passing position at a maximum velocity without performing acceleration and deceleration operations. This can implement high speed positioning control with low power consumption.

According to a fourth aspect of the present invention, there is provided a positioning control method as defined in any one of the first to third aspects, wherein each of the drive units performs only one acceleration operation and only one deceleration operation between the original position to the target position.

In this positioning control method, one acceleration and deceleration operation makes it possible to reach the target position. Accordingly, compared to a case of performing a plurality of acceleration and deceleration operations, driving efficiency can be increased and power consumption can be reduced.

According to a fifth aspect of the present invention, there is provided a positioning control method as defined in the fourth aspect, wherein each drive unit performs the acceleration and deceleration operations with constant acceleration.

In this positioning control method, acceleration and deceleration operations up to the target position are performed with constant acceleration.

According to a sixth aspect of the present invention, there is provided a positioning control method as defined in the fourth aspect, wherein each drive unit performs the acceleration and deceleration operations based on a preset velocity change pattern.

According to a seventh aspect of the present invention, there is provided a positioning control method as defined in the fourth aspect, wherein each drive unit performs the acceleration and deceleration operations based on a preset velocity change pattern including a curvilinear velocity change.

In this positioning control method, acceleration and deceleration operations up to the target position may be performed based on an arbitrary velocity change pattern, which facilitates setting of desired acceleration and deceleration operations.

According to an eighth aspect of the present invention, there is provided a positioning control method as defined in the sixth or seventh aspect, wherein a velocity of the acceleration and deceleration operations based on the velocity change pattern is set with reference to a conversion table that defines a relationship between a driving time and a travel amount within the driving time.

According to a ninth aspect of the present invention, there is provided a positioning control method as defined in the sixth or seventh aspect, wherein a necessary time for each drive unit to drive from the original position to the operational passing position based on the velocity change pattern is set with reference to a conversion table that defines a relationship between the travel amount and the driving time.

According to a tenth aspect of the present invention, there is provided a positioning control method as defined in the fifth or seventh aspect, wherein when the movable body passes the operational passing position, both drive units operate for moving the movable body at a maximum velocity.

According to an eleventh aspect of the present invention, there is provided a positioning control method as defined in the fifth or seventh aspect, wherein when the movable body passes the operational passing position, each drive unit operates for moving the movable body during acceleration and deceleration operations.

In this positioning control method, a velocity is set with reference to the conversion table that defines a relationship between driving time and a travel amount, which facilitates driving control without complicated calculation, thereby implementing simplified driving control.

According to a twelfth aspect of the present invention, there is provided a positioning control device for controlling movement of a movable body from an original position to a target position by individually driving a plurality of drive units for moving the movable body in directions orthogonal to each other while avoiding passing of the movable body through a passing avoidance region, comprising:

a setting section for setting an operational passing position that is a passing point in a travel route of the movable body for avoiding the passing avoidance region;

a calculation section for calculating a necessary driving time for each travel distance in each drive direction for moving the movable body from the original position to the operational passing position; and a command section for outputting a command for starting driving of the drive unit having a smaller travel distance from the original position to a coordinate of the operational passing position, later than operation timing of the drive unit having a longer travel distance, from the original position to another coordinate of the operational passing position, based on a calculated difference of necessary times for driving these respective drive units.

In this positioning control device, driving start timing of the drive unit having the smaller travel distance from the original position to its coordinate of the operational passing position is delayed by a specified period of time from driving start time of the drive unit having the longer travel distance, which enables passing of the movable body through the operational passing position at a maximum velocity without performing acceleration and deceleration operations. This can implement high speed positioning control with low power consumption.

According to a thirteenth aspect of the present invention, there is provided a component mounting apparatus, comprising:

a component feed unit for feeding components;

a transfer head for placing a component fed from the component feed unit onto a circuit board;

a plurality of drive units for moving the transfer head in directions orthogonal to each other; and a positioning control device for controlling movement of the transfer head from an original position to a target position by performing individual operational control of each of the drive units while avoiding passing of the transfer head through a passing avoidance region, wherein the positioning control device comprises:

a setting section for setting an operational passing position that is a passing point in a travel route of the movable body for avoiding the passing avoidance region;

a calculation section for calculating a necessary driving time for each travel distance in each drive direction for moving the movable body from the original position to the operation passing position; and a command section for outputting a command for starting driving of the drive unit having a smaller travel distance from the original position to a coordinate of the operational passing position, later than driving start timing of the drive unit having a longer travel distance, from the original position to another coordinate of the operational passing position, based on a calculated difference of necessary times for driving these respective drive units.

In this electronic component mounting apparatus, the setting section, the calculation section, and the command section perform driving control so as to pass the movable body through the operational passing position set by the setting section for avoiding the passing avoidance region at a maximum speed without performing acceleration and deceleration operations, thereby implementing high speed positioning with low power consumption. This enables positioning and mounting of electronic components in a short period of time, resulting in increased mounting efficiency of components.

BRIEF DESCRIPTION OF DRAWINGS

These and other aspects and features of the present invention will become clear from the following description taken in conjunction with the preferred embodiments thereof with reference to the accompanying drawings, in which:

FIGS. 4A and 4B are block diagrams each showing structure of a positioning control device for use in the electronic component mounting apparatus of FIG. 1;

FIG. 9 is a comprehensive view showing a calculation method of necessary times $t_1$ and $t_2$ for moving the transfer head of the electronic component mounting apparatus of FIG. 1 from the original position $P_0$ to the operational passing position $P_1$ with constant acceleration in each expected case;

FIGS. 24A and 24B are block diagrams each showing structure of a positioning control device in a second embodiment of the present invention;

FIG. 26 is a comprehensive view showing a calculation method of necessary time t ($t_0$, $t_2$) for moving the transfer head of the electronic component mounting apparatus according to the second embodiment from the original position $P_0$ to the operational passing position $P_1$ with an arbitrary accelerating curve in each expected case;

DETAILED DESCRIPTION OF THE PREFERRED EMBODIMENTS

Figure 1:
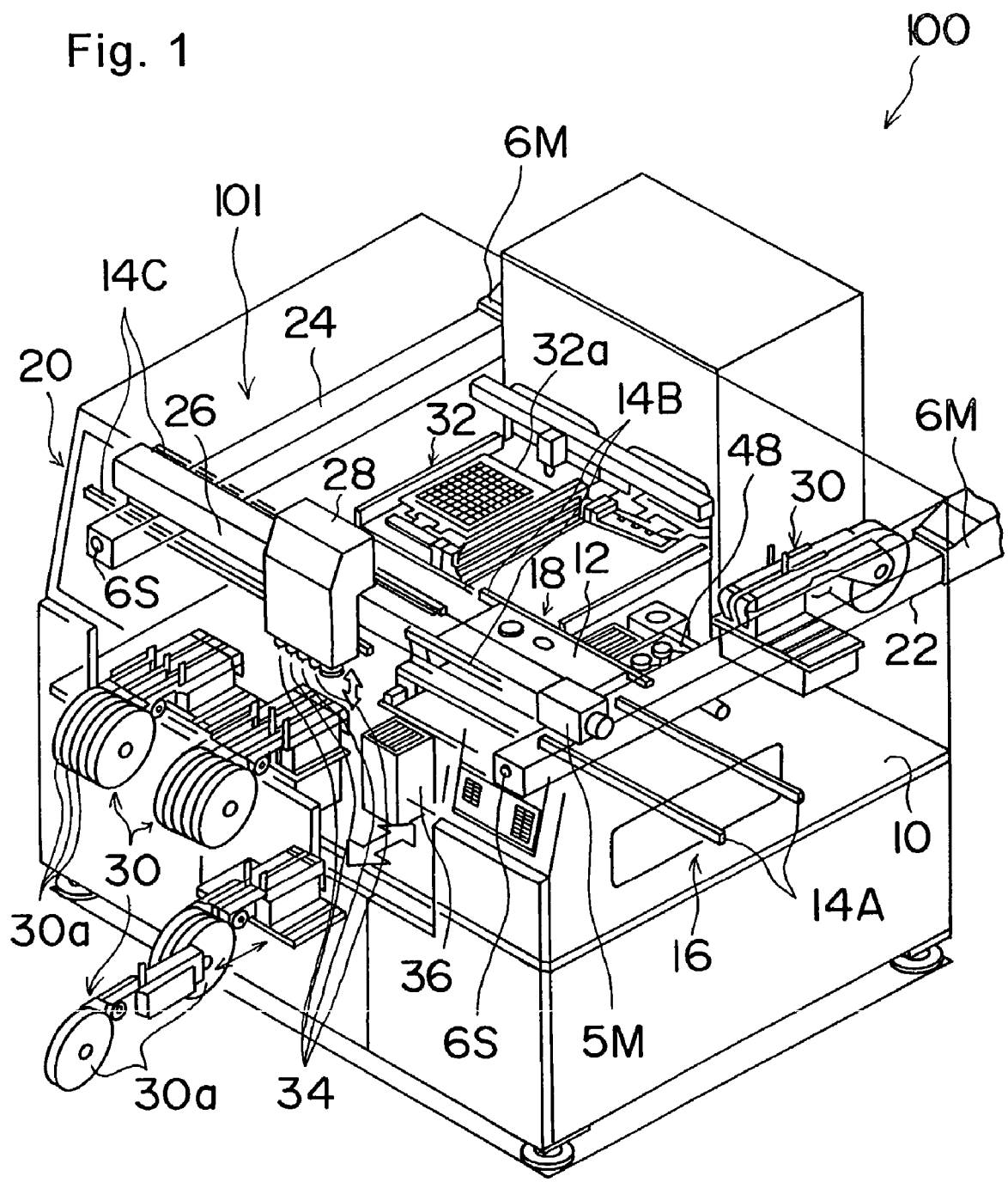
FIG. 1 is a see-through perspective view showing an electronic component mounting apparatus incorporating a positioning control device according to a first embodiment of the present invention.

Before description of the present invention proceeds, it is to be noted that like parts are designated by like reference numerals throughout the accompanying drawings.

A first embodiment of the present invention will be described in detail with reference to accompanied drawings.

Detailed description will now be given of a positioning control method, a positioning control device, and an electronic component mounting apparatus using the same according to the first embodiment of the present invention with reference to drawings.

Figure 2:
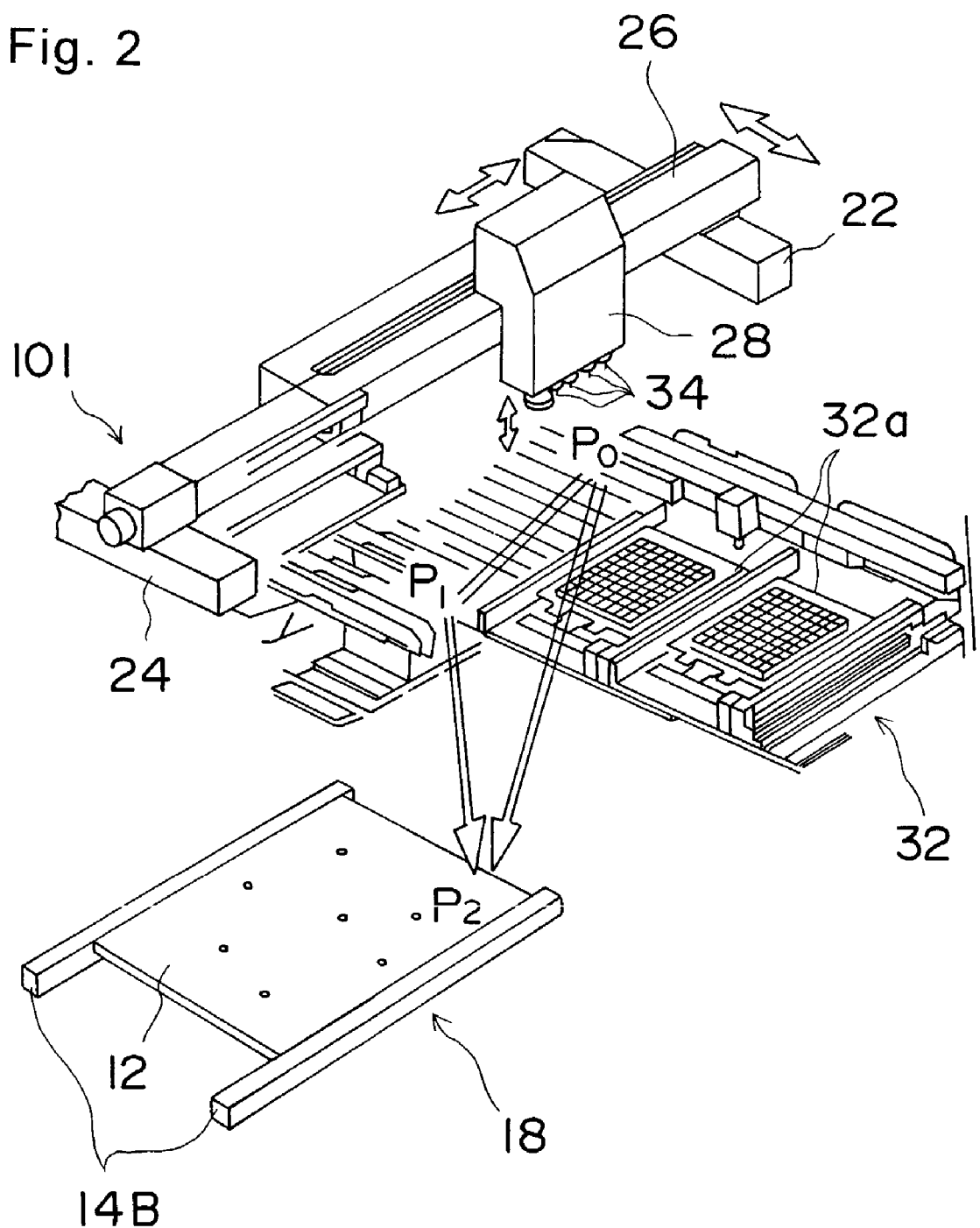
FIG. 2 is a perspective view showing a transfer head, a circuit board, and a part tray of the electronic component mounting apparatus shown in FIG. 1 in a condition that the transfer head and the circuit board are rotated approximately 90 degrees relative to the part tray.

FIG. 1 is a perspective view showing an electronic component mounting apparatus incorporating a positioning control device according to the first embodiment of the present embodiment, and FIG. 2 is a perspective view showing a transfer head included therein. Although in the first embodiment, there is shown one example in which the positioning control method is applied to an electronic component mounting apparatus, the present invention is not limited to this example. The present invention may be applied, for example, to an assembly device for performing assembly with use of a transfer head that holds and transfers components.

Description will now be given of structure of electronic component mounting apparatus 100 in the first embodiment.

As shown in FIG. 1, on a board conveyance route along a board conveyance direction in a center of a top face of a base 10 in electronic component mounting apparatus 100, there are provided a pair of first guide rails 14A, second guide rails 14B, and third guide rails 14C, each having a pair of conveyer belts for conveying a circuit board 12. By the conveyer belt of the first guide rails 14A in a loader unit 16 at one end of the board conveyance route, the circuit board 12 is conveyed from the loader unit 16 to a pair of the second guide rails 14B of an XY table 18 in a mounting position of electronic components. By the pair of the second guide rails 14B of the XY table 18 in the mounting position, mounted circuit board 12 is conveyed from the pair of the second guide rails 14B to the pair of the third guide rails 14C in an unloader unit 20 at another end of the board conveyance route. The XY table 18 having the pair of the second guide rails 14B functions as an example of a board holding device, which can convey the circuit board 12 in orthogonal X and Y directions.

The base 10 is further provided with an XY robot 101. The XY robot 101 is equipped with a pair of Y-axis robots 22 and 24 parallel to the Y axis. On these two Y-axis robots 22 and 24, there is suspended an X-axis robot 26 parallel to the X axis. Driving the Y-axis robots 22 and 24 moves the X-axis robot 26 over the Y-axis robots 22 and 24 in the Y direction. The X-axis robot 26 is equipped with a transfer head 28 that exemplifies a movable body. Driving the X-axis robot 26 moves the transfer head 28 over the X-axis robot in the X direction. This makes it possible to move the transfer head 28 within an X-Y plane.

The transfer head 28, that is mounted on the XY robot 101 composed of the X-axis robot 26 and the Y-axis robots 22 and 24 and freely moves in the X-Y plane (horizontal plane), is structured so as to suck desired electronic components one by one, or in a batch in a simultaneous manner with use of a plurality of (e.g. four) suction nozzles 34 from, for example, a part feeder 30 for feeding electronic components such as resistance chips and chip capacitors, or from a part tray unit 32 for feeding ICs such as SOP (small Outline Package) and QFP (Quad Flat Package) and relatively large electronic components such as connectors (the part feeder 30, the part tray unit 32, and the like are referred to as a component feed unit as a whole), and to respectively mount respective electronic components in specified locations on the circuit board 12. Such mounting operation of the electronic components is controlled by a control device 50 of FIG. 3 based on an operational procedure instructed by a mounting program 56 (see FIG. 3) preinstalled in a storage section 55 shown in FIG. 3.

Part feeders 30 are provided in parallel on the lower left side of FIG. 1 in a board conveyance direction of the second and third guide rails 14B and 14C. Each of the part feeders 30 is equipped with a tape-shaped component roll 30a accommodating electronic components such as resistance chips and chip capacitors.

The part tray unit 32 is provided on the upper right side in FIG. 1 in the board conveyance direction of the second and third guide rails 14B and 14C. As one example, there can be provided in total two trays 32a whose longer sides are orthogonal to the second and third guide rails 14B and 14C. Each tray 32a is structured so as to slide to the second and third guide rails 14B and 14C side depending on a feed number of components for maintaining a component taking-out position in the Y direction constant in order to steady a Y-directional position of the transfer head 28 for sucking components from the part tray unit 32. On the tray 32a, there are mounted ICs such as SOP and QFP as well as relatively large electronic components such as connectors.

On a side portion of the circuit board 12 positioned by the second guide rails 14B, there is provided a component recognizing device 36 for detecting two-dimensional deviation (suction attitude) of an electronic component sucked by suction nozzle 34 so that the transfer head 28 can correct a position for canceling the deviation.

Figure 3:
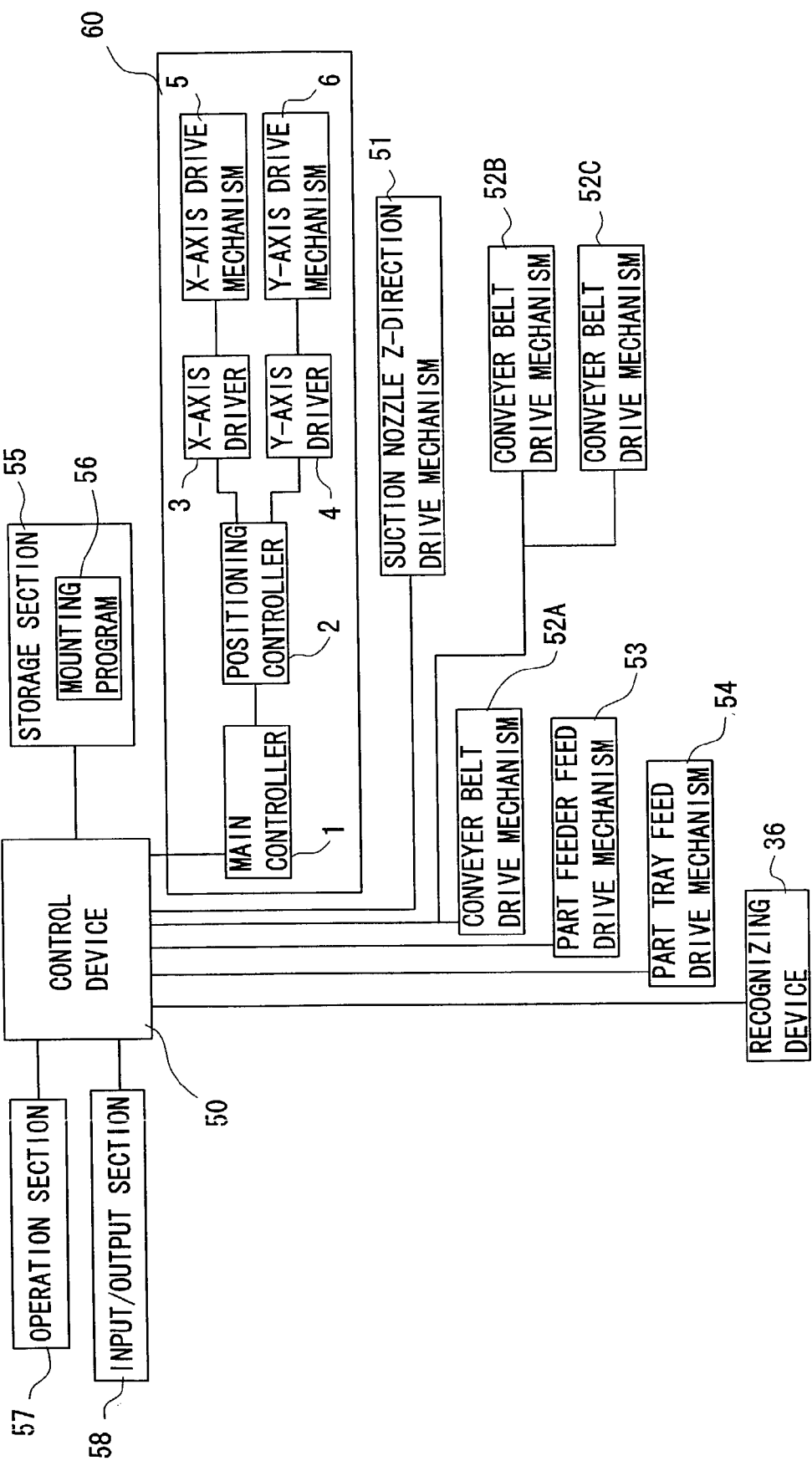
FIG. 3 is a block diagram showing structure of a control system of the electronic component mounting apparatus of FIG. 1.

Description will now be given of structure of a control system of the electronic component mounting apparatus 100 with reference to FIG. 3.

The control device 50 performs overall control of the electronic component mounting apparatus 100 including control of a positioning control device 60, a suction nozzle Z-direction drive mechanism 51 for operating the suction nozzles 34 placed on the transfer head 28 in an up-and-down direction, i.e., Z direction with use of an air cylinder or the like, conveyor belt drive mechanisms 52A, 52B, and 52C of the guide rails 14A, 14B, and 14C, a part feeder feed drive mechanism 53 for intermittently rotating component roll 30a of part feeder 30 so that the part feeder 30 performs a component feeding operation, and a part tray feed drive mechanism 54 for sliding tray 32a of the part tray unit 32 so that the part tray unit 32 performs a component feed operation. The positioning control device 60 is composed of a main controller 1, a positioning controller 2, an X-axis driver 3, a Y-axis driver 4, an X-axis drive mechanism 5 for driving the X-axis robot 26, and a Y-axis drive mechanism 6 for driving the Y-axis robots 22 and 24.

The control device 50 has the storage section 55, which stores information necessary for control. The control device 50 performs control by reading the information therefrom. For example, the control device 50 reads the mounting program 56, which is stored in the storage section 55, and performs control so that electronic components specified in the mounting program 56 are mounted on mounting coordinates in X and Y directions on a circuit board. Particularly, the control device 50 instructs the positioning control device 60 to move the transfer head 28 to the X and Y coordinates specified in the mounting program 56.

The control device 50 also executes correction of the X and Y coordinates specified in the mounting program 56 based on deviation of an electronic component detected by the component recognizing device 36 and sucked by the suction nozzle 34, and gives instruction to the positioning control device 60 to move the transfer head 28 to corrected X and Y coordinates.

The control device 50 is further provided with an operational section 57 made up of such member as a CRT, a keyboard, or the like for operating the electronic component mounting apparatus 100, and an input/output section 58 for sending and receiving data such as the mounting program 56 to/from external devices.

Description will now be given of an outline of general operations of the electronic component mounting apparatus 100 structured as above.

Upon conveyance of the circuit board 12 from the first guide rails 14A of the loader unit 16 to the XY table 18 in a specified mounting position, the transfer head 28 moves within the XY plane by virtue of the XY robot 101, sucks a desired electronic component from part feeder 30 or the part tray unit 32, moves over a posture recognition camera of the component recognizing device 36, checks a suction posture of the electronic component, and executes correction of the suction posture. After that, the transfer head 28 mounts the electronic component in a specified position on the circuit board 12.

When each mounting head sucks an electronic component from the part feeder 30 or the part tray unit 32 by virtue of suction nozzle 34, or mounts the electronic component in a specified position on the circuit board 12, the suction nozzle 34 in the XY plane is lowered in a vertical direction (Z direction). Depending on types of electronic components, the suction nozzle 34 is appropriately replaced for performing a placement operation.

By repeating a series of mounting operations including suction of electronic components, recognition of the components, and placing thereof on the circuit board 12, mounting of electronic components on the circuit board 12 is completed. Mounting-completed circuit board 12 is carried out from the second guide rails 14B of the XY table 18 in the mounting position to the third guide rails 14C of the unloader unit 20, while a new circuit board 12 is carried in from the first guide rails 14A of the loader unit 16 to the second guide rails 14B of the XY table 18 in the mounting position, and the above stated mounting operations are repeated.

In the electronic component mounting apparatus 100 of the first embodiment, when the transfer head 28 places an electronic component removed from the part tray unit 32 onto the circuit board 12 as shown in FIG. 2, the part tray unit 32 itself, for example, may be an obstacle of straightline travel of the transfer head 28. In this case, a region occupied by the part tray unit 32 is regarded as a passing avoidance region PAR. Consequently, the transfer head 28 needs to be moved with the part tray unit 32 being avoided like $P_0 \rightarrow P_1 \rightarrow P_2$ as shown in FIG. 2. To move the transfer head 28 along this curved travel route at higher speed, positioning control will be performed as shown below.

Although the passing avoidance region PAR is herein exemplified by the region occupied by the part tray unit 32, it is not limited thereto, and any region which hinders straightline travel without an uplift operation of the transfer head 28 in light of mounting tact reduction may be regarded as the passing avoidance region PAR.

For example, the passing avoidance region PAR may be a region occupied by a replacement position of suction nozzle 34 of the transfer head 28. In the replacement position of the suction nozzle 34, there are spare nozzles 34 in standby for replacement, which may hinder straightline travel of the transfer head 28.

The passing avoidance region PAR may also be a region occupied by components already mounted on the circuit board 12. A tall component may hinder straightline travel of the transfer head 28, where moving the transfer head 28 on a route avoiding the component achieves faster mounting than moving the suction nozzle 34 up and down and moving the transfer head 28 straight while avoiding the component.

The passing avoidance region PAR may also be a region occupied by part feeders.

In a case where other transfer heads 28 are present in the component mounting apparatus, the passing avoidance region PAR may be provided to avoid interference with these other transfer heads 28 or to prepare for these other transfer heads coming to a standstill due to failure.

Description will now be given of positioning control of the transfer head 28 in the electronic component mounting apparatus 100.

Figure 37:
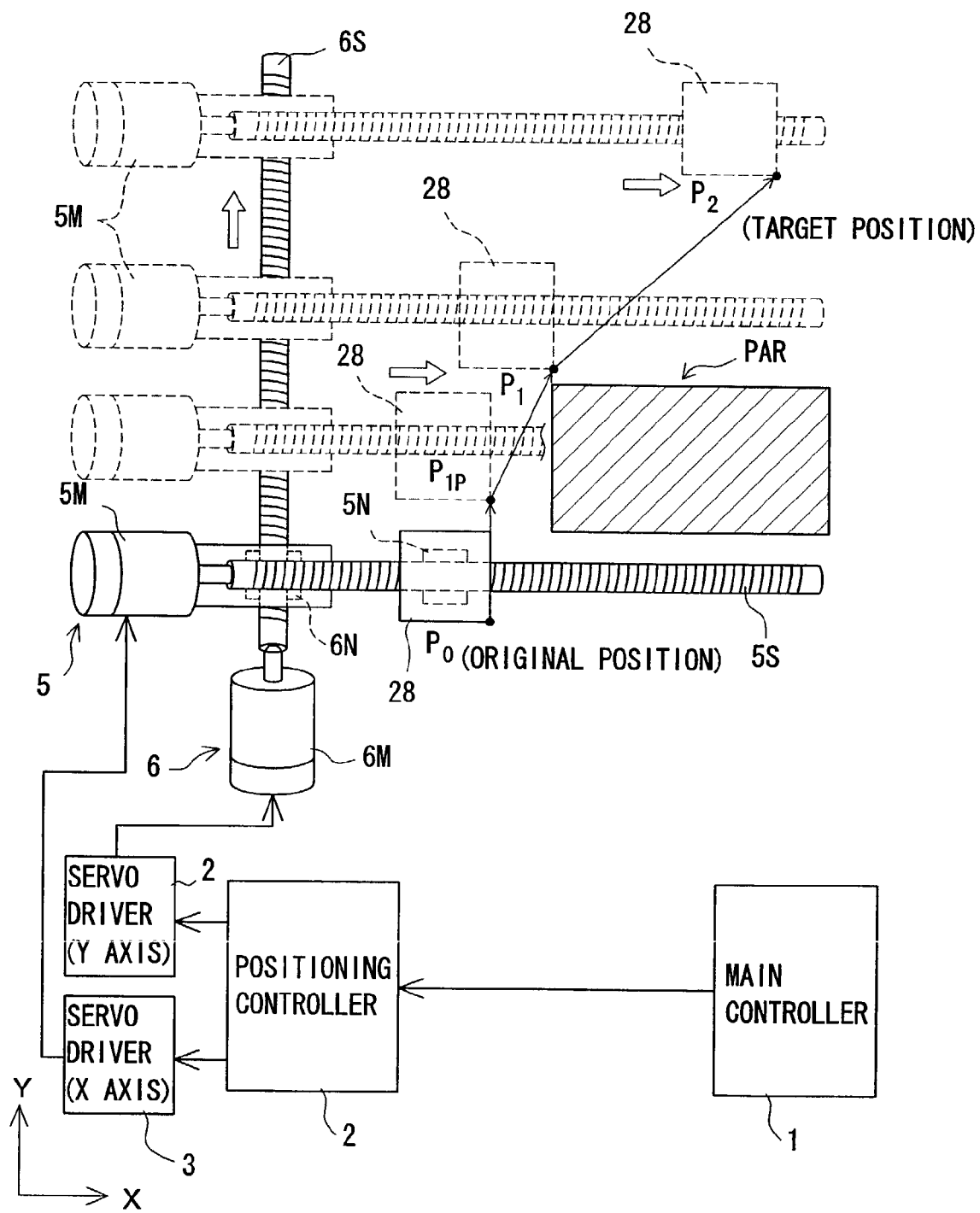
FIG. 37 is a view showing structure of a drive mechanism of the transfer head of the electronic component mounting apparatus of the first embodiment.

FIG. 4A is a block diagram showing structure of the positioning control device 60 for use in the electronic component mounting apparatus 100 in the first embodiment. As shown in FIG. 4A, the positioning control device 60 in the first embodiment is a control device for performing positioning control of the transfer head 28 which can move in X and Y directions that are orthogonal to each other. The positioning control device 60 is provided with: a main controller 1 for outputting respective commands of a moving target position $P_2$ of the transfer head 28, an operable maximum velocity $V_{max}$ of the transfer head 28, an operable maximum acceleration $\alpha_{max}$ of the transfer head 28, an operational passing position $P_1$ for avoiding passing of the transfer head 28 through the passing avoidance region PAR, a specification axis A of the transfer head 28 for specifying a delayed operation start based on a later-described operational start delay time, and each operation start command C that is a driving start timing of the transfer head 28; a positioning controller 2 for calculating a velocity value at which the transfer head 28 is moved in accordance with a command from the main controller 1, and outputting a velocity command based on a calculated velocity value; an X-axis driver 3 for individually driving and controlling an X-axis servomotor 5M, as one example of a transfer head drive unit, in accordance with a command from positioning controller 2; a Y-axis driver 4 for synchronously driving and controlling a pair of Y-axis servomotors 6M, as an example of a transfer head drive unit, in accordance with a command from the positioning controller 2; an X-axis drive mechanism 5 composed of an X-axis servomotor 5M driven by an X-axis servo driver 3 of the X-axis robot 26 as shown in FIG. 37, a screw shaft 5S forwardly-and-reversely-rotated by the X-axis servomotor 5M, and a nut member 5N geared onto the screw shaft 5S and fixed to the transfer head 28; and a Y-axis drive mechanism 6 composed of a Y-axis servomotor 6M driven by a Y-axis servo driver 4, a screw shaft 6S forwardly-and-reversely-rotated by the Y-axis servomotor 6M, and a nut member 6N geared onto the screw shaft 6S and provided with an X-axis robot 26.

Structure of the positioning controller 2 is shown in FIG. 4B.

Numeral 120 denotes a setting section for setting the operational passing position P1 of the transfer head 28 inputted by the main controller 1, 121 denotes a calculation section for calculating necessary time for driving each of the X-axis robot 26, and Y-axis robots 22 and 24 until the transfer head 28 passes the operational passing position $P_1$ (detailed description will be given later), and 122 denotes a command section for giving velocity commands in consideration of drive start timing of each of X axis and Y axis based on the necessary time calculated in the calculation section 121.

Figure 5:
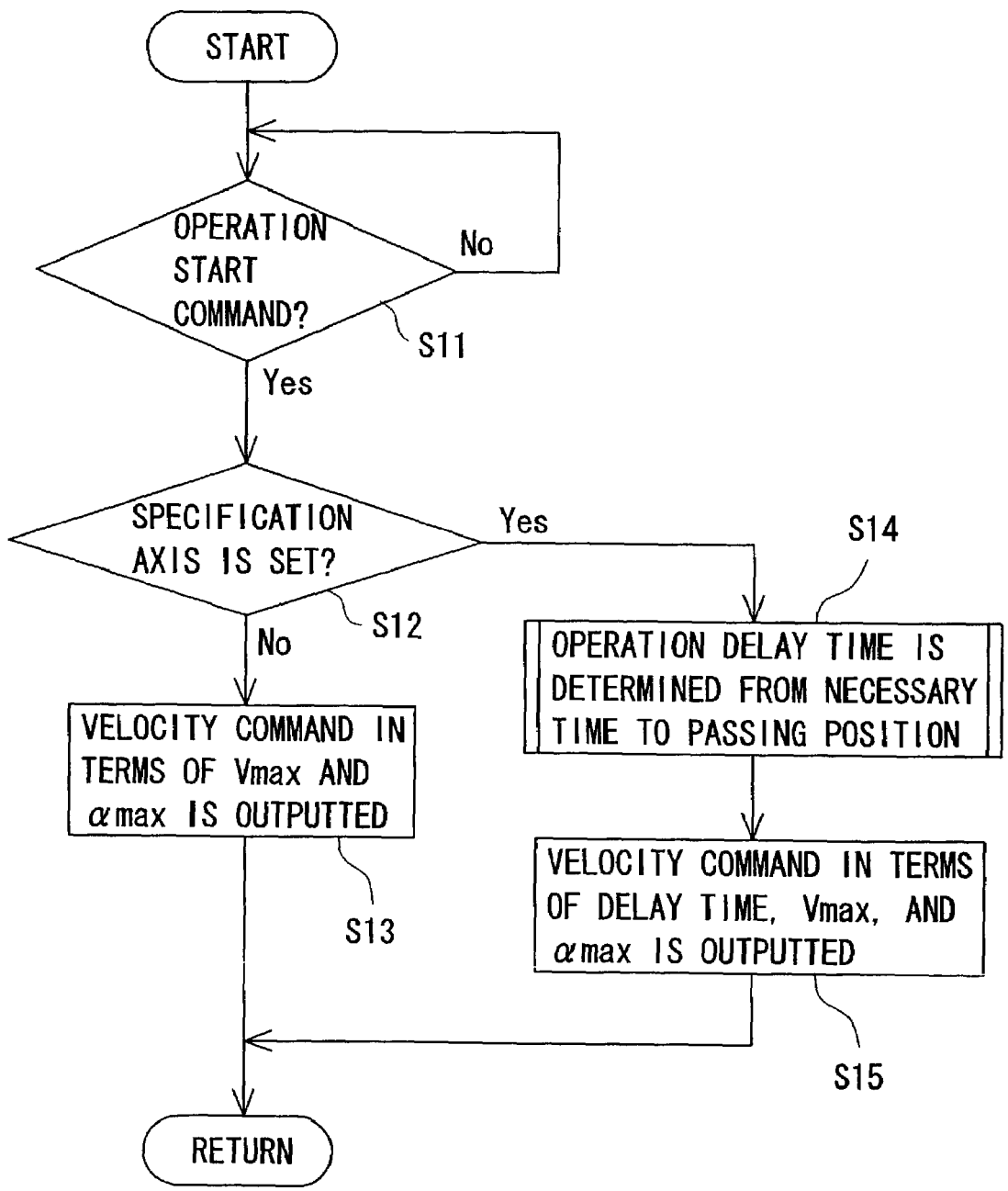
FIG. 5 is a flow chart showing an outline of a velocity curve operation and output operation of a velocity command performed by a positioning controller of the electronic component mounting apparatus of FIG. 1.

Description will be made of an outline of an operation of a velocity value and output operation of a velocity command performed by the positioning controller 2 with reference to the flow chart of FIG. 5.

First, the main controller 1 outputs an operation passing position $P_1$ of the transfer head 28, a specification axis A, a target position $P_2$ of the transfer head 28 in movement, a maximum velocity $V_{max}$ of the transfer head 28 in movement, and a maximum acceleration αmax of the transfer head 28 in movement, and outputs an operational start command C in response to an operation command based on the mounting program 56 from the electronic component mounting apparatus 100 (Step 11: hereinafter stated as S11).

Figure 35:
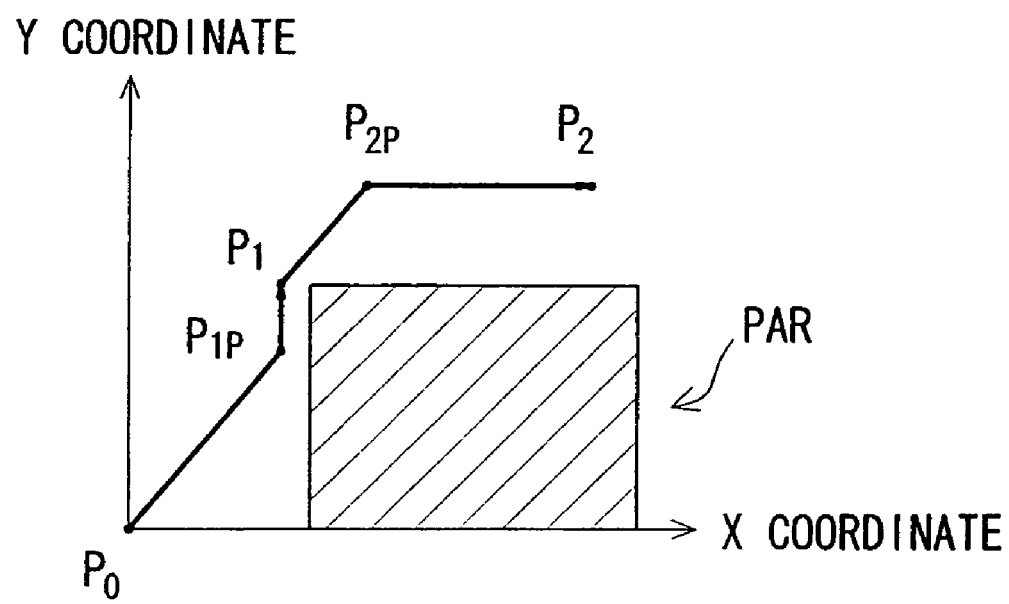
FIG. 35 is a schematic view showing a positioning operation for avoiding a passing avoidance region in another conventional positioning control device.
Figure 36:
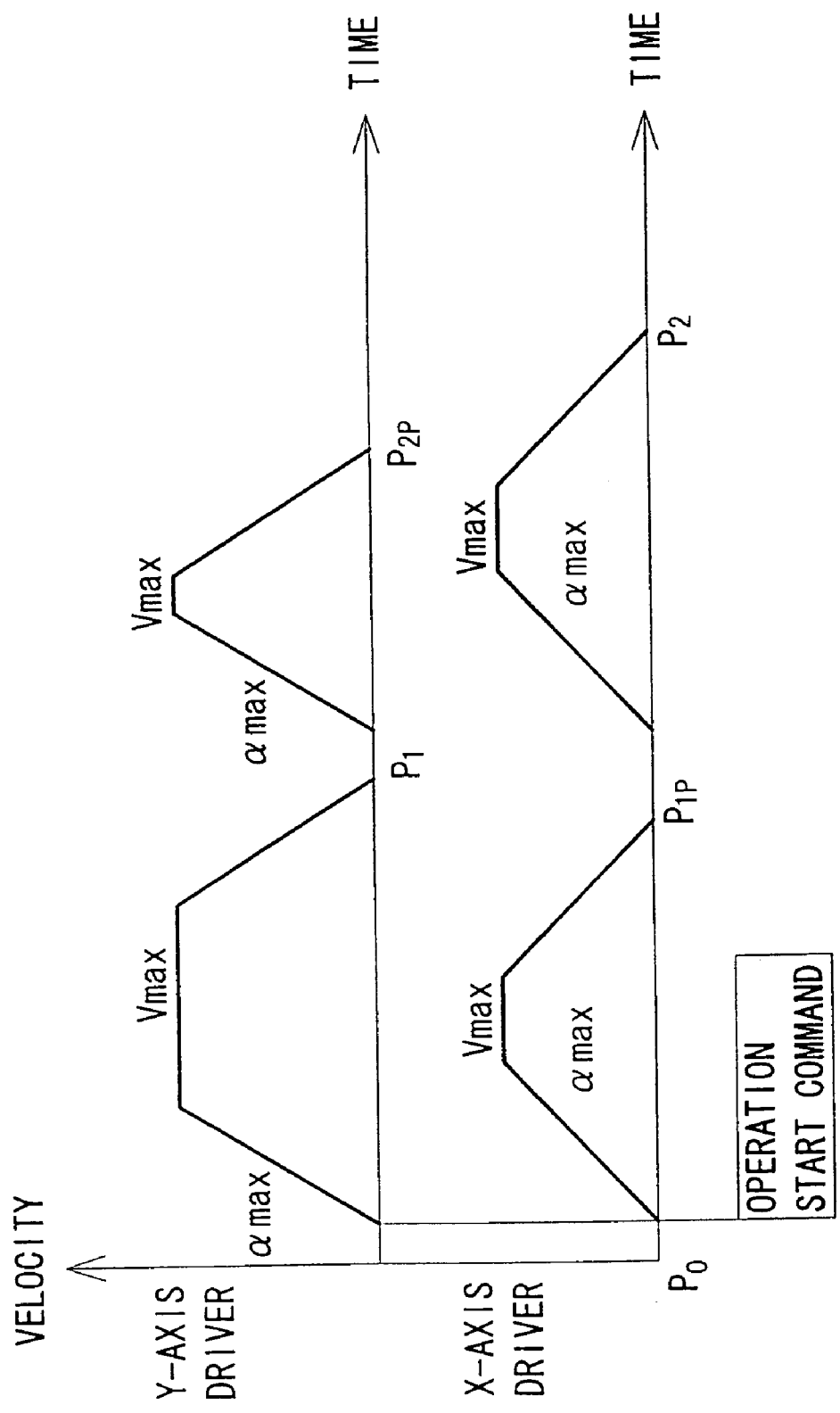
FIG. 36 is a view showing a driving pattern of the transfer head in the case shown in FIG. 35.

Next, the positioning controller 2 determines whether or not a specification axis is set (S12). The term "specification axis", detailed description of which will be given later, refers herein to an axis of a robot having a smaller movement distance between the X-axis robot 26 and the Y-axis robots 22 and 24, which are driven when the transfer head 28 is moved from original position $P_0$ to the operational passing position $P_1$. In a case where the specification axis is not set, there is performed positioning control in which a conventional velocity command, for example, in terms of maximum velocity $V_{max}$ and maximum acceleration $\alpha_{max}$ shown in FIG. 35, is outputted (S13).

In a case where the specification axis is set, each axis is driven by the positioning control method according to the first embodiment and positioning control of the transfer head 28 is performed.

In outline, a necessary time for the transfer head 28 to move to the operational passing position $P_1$ in each of X axis and Y axis is calculated based on an equation described later, and from an obtained difference of necessary times, operational start delay time T is determined (S14). This operation will be described in detail later. Then, a velocity command based on the operational start delay time T, the maximum velocity $V_{max}$, and the maximum acceleration $\alpha_{max}$ is outputted (S15).

Such control enables the X-axis drive mechanism 5 and the Y-axis drive mechanism 6 to simultaneously pass the operational passing position $P_1$ at the maximum velocity $V_{max}$, with acceleration performed with the maximum acceleration $\alpha_{max}$ to reach the maximum velocity $V_{max}$ without performing acceleration and deceleration operations. This makes it possible to carry the transfer head 28 to the target position $P_2$ with only one acceleration operation and only one deceleration operation performed during travel between the original position $P_0$ and the target position $P_2$, thereby implementing high speed positioning control with low power consumption.

Hereinbelow, detailed operation of the positioning control will be described in sequence.

Figure 6:
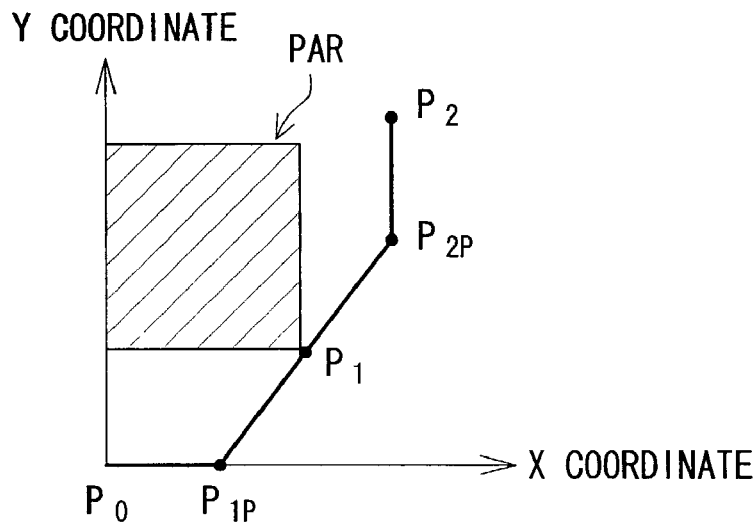
FIG. 6 is a view showing a case of moving the transfer head from an original position $P_0$ to a target position $P_2$ via an operational passing position $P_1$ with presence of a passing avoidance region in the electronic component mounting apparatus of FIG. 1.

As an example, there is taken a case of moving the transfer head 28 from the original position $P_0$ to the target position $P_2$ via the operational passing position $P_1$ with presence of a passing avoidance region PAR as shown in FIG. 6. Between the original position $P_0$ and the operational passing position $P_1$, and between the operational passing position $P_1$ and the target position $P_2$, there are provided $P_{1P}$ and $P_{2P}$ as middle passing positions, respectively. This means that the transfer head 28 moves in a route in order of $P_0 \rightarrow P_{1P} \rightarrow P_1 \rightarrow P_{2P} \rightarrow P_2$.

Figure 7:
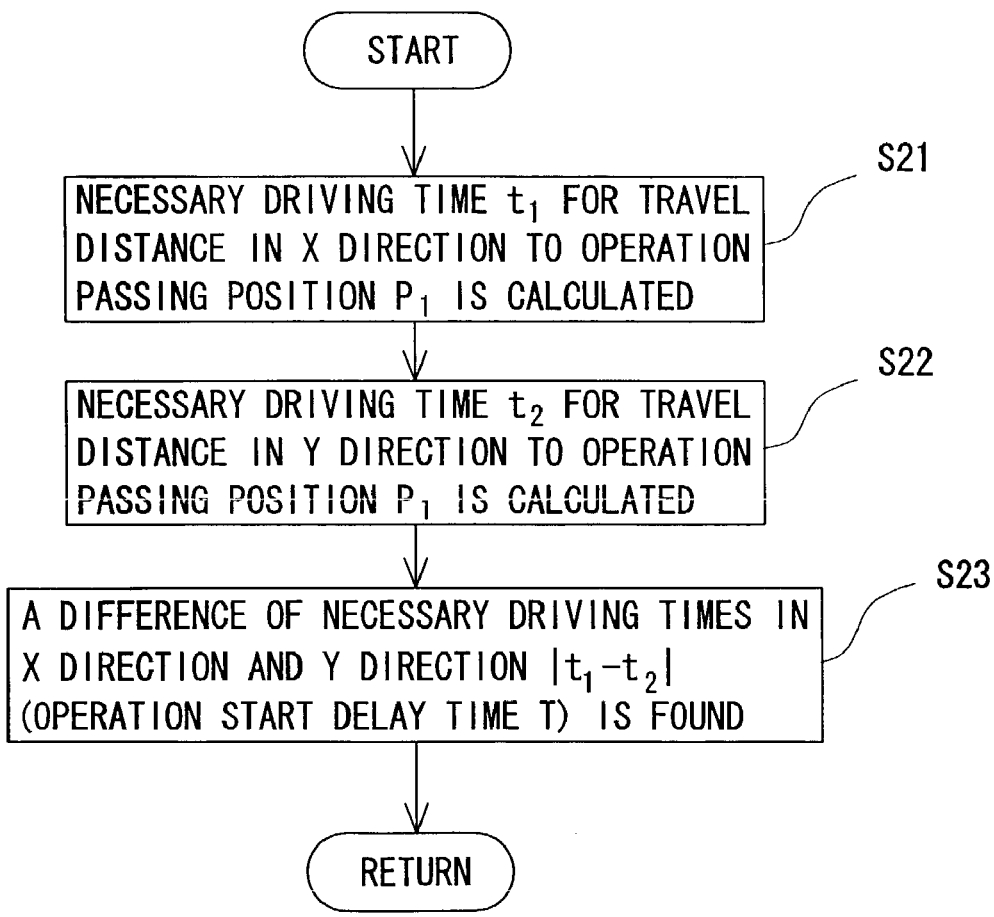
FIG. 7 is a flow chart showing a procedure for determining an operational start delay time of the electronic component mounting apparatus of FIG. 1.

A procedure for determining the operational start delay time in S14 is shown in the flow chart of FIG. 7. According to FIG. 7, first, there is calculated necessary driving time $t_1$ for travel distance from the original position $P_0$ to the operational passing position $P_1$ in X direction, corresponding to a relationship between X directional travel distance and Y directional travel distance from the original position $P_0$ to the operational passing position $P_1$, and each maximum acceleration $\alpha_{max}$ of X axis and Y axis (specifically, X-directional maximum acceleration: $\alpha_{1max}$ and Y-directional maximum acceleration: $\alpha_{2max}$) and maximum velocity $V_{max}$ (specifically X-directional maximum velocity $V_{1max}$ and Y-directional maximum velocity $V_{2max}$) (S21). In the same manner, there is calculated necessary time $t_2$ for travel distance in Y direction (S22).

Next, from obtained necessary times $t_1$ and $t_2$, a difference $T=(t_1-t_2)$ is calculated (S23) and used as operational start delay time T.

Figure 8:
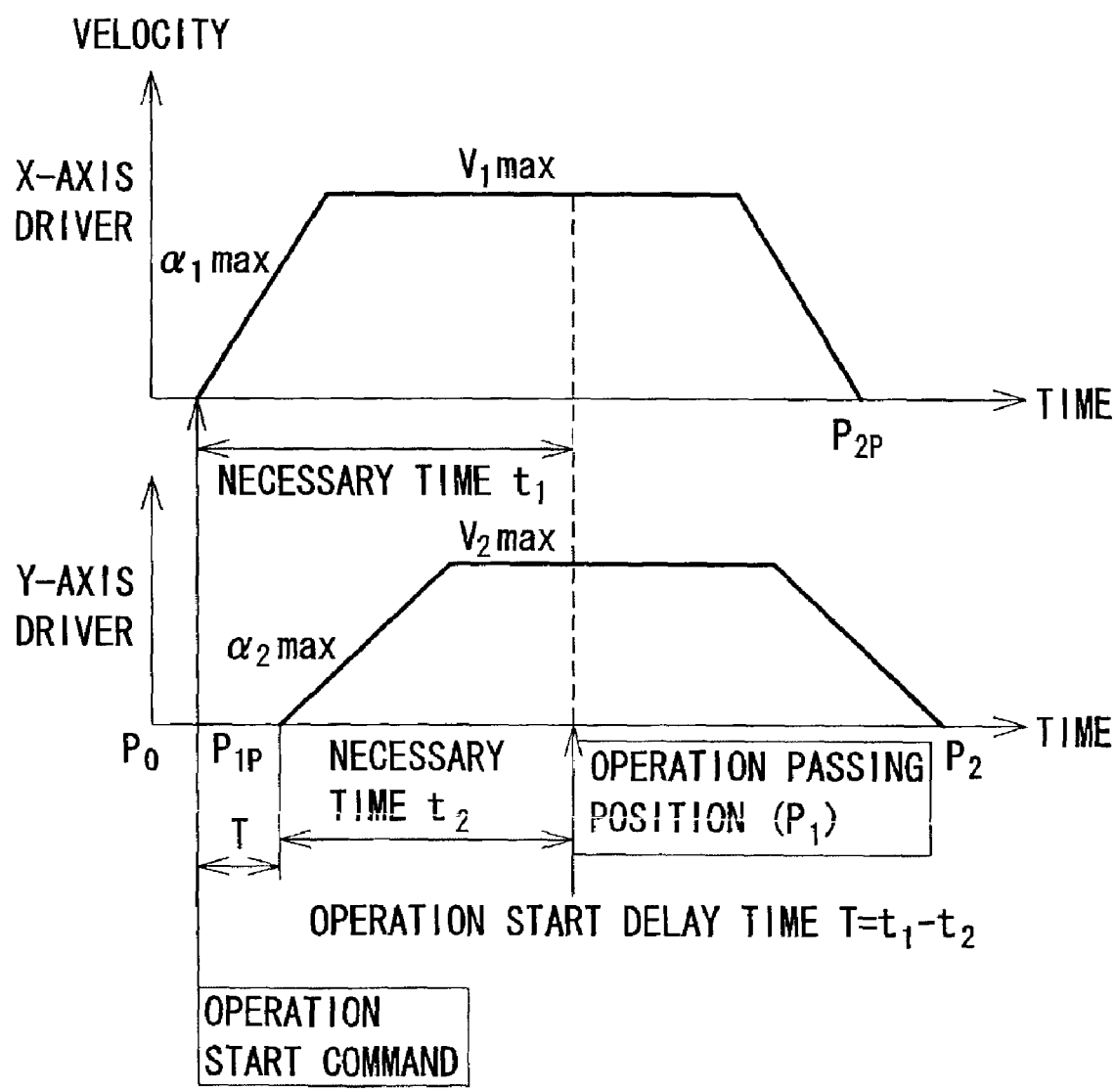
FIG. 8 is a view showing a specific outline of positioning control in the electronic component mounting apparatus of FIG. 1, i.e., a relationship between a time taken for moving the transfer head and a moving velocity.

FIG. 8 shows a specific outline of positioning control. For moving the transfer head along the above route, the transfer head 28 is controlled separately along the X axis (X-axis robot 26) and Y axis (Y-axis robots 22 and 24) according to a relationship between a time and a moving velocity shown in FIG. 8. As shown in FIG. 6, in the X direction, where a travel distance from the original position $P_0$ to a corresponding coordinate of the operational passing position $P_1$ is longer than that in the Y direction, a necessary time for moving from the original position $P_0$ to this coordinate of the operational passing position $P_1$ is expressed as $t_1$, whereas in the Y direction, where the travel distance is shorter than that in X direction, a necessary time for moving from the original position $P_0$ to a Y-axis coordinate of the operational passing position $P_1$ is expressed as $t_2$.

For passing the transfer head 28 through the operational passing position $P_1$ at maximum velocity $V_{max}$ both along the X axis and Y axis, driving along the X axis is started when the operational start command is outputted. Driving along the Y axis is started by a specified time later than the time when the operational start command is outputted, so that the transfer head 28 can pass the operational passing position $P_1$ at the same time in the X direction and the Y direction. The operational start delay time T is obtained by $|t_1-t_2|$.

Described above is a basic concept of the method for calculating the driving start delay time in the first embodiment. In actuality, a specific method for calculating the driving start delay time is different by conditions including an original position, an operational passing position, a target position, a passing avoidance region PAR, and the like. Detailed description in each case will be given below.

FIG. 9 is a comprehensive view showing a calculation method of necessary times $t_1$ and $t_2$ for moving the transfer head 28 from the original position $P_0$ to the operational passing position $P_1$ with constant acceleration during acceleration and deceleration operations, and with constant velocity during other operations as shown in FIG. 8 in each expected case.

Figure 10:
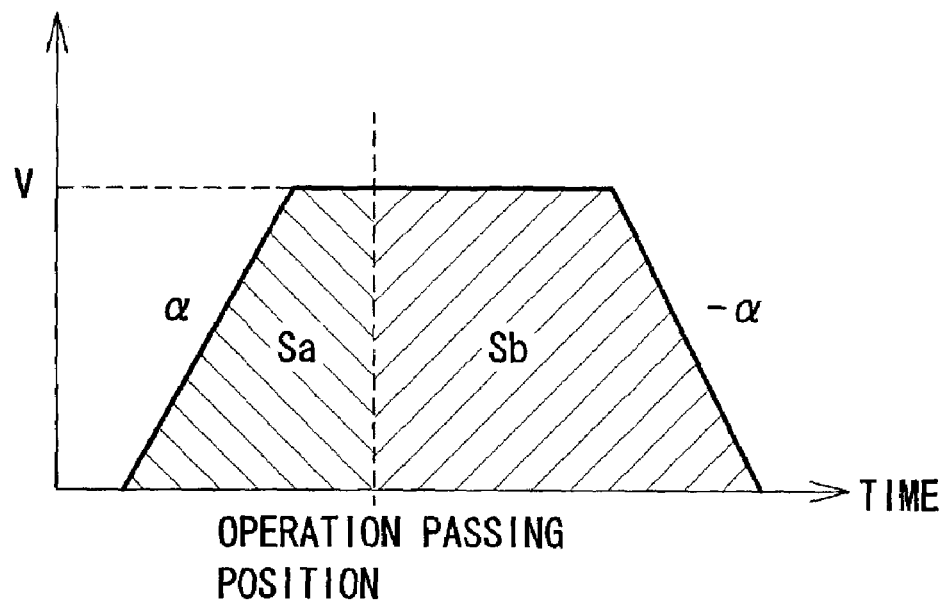
FIG. 10 is a view explaining a travel distance Sa, i.e., an integral value of a velocity from an operational start position to the operational passing position $P_1$, and a travel distance Sb from the operational passing position to an operational end position in the electronic component mounting apparatus of FIG. 1.

As shown in FIG. 10, reference character Sa denotes an integral value of a velocity, i.e., a travel distance from an operational start position to the operational passing position $P_1$, and reference character Sb denotes a travel distance of the transfer head 28 from the operational passing position to an operational end position. Reference character V denotes a maximum velocity $V_{max}$ of the transfer head 28, and a denotes a maximum acceleration $\alpha_{max}$ of the transfer head 28.

Description of each case will be given hereinafter in sequence.

First Case: $Sa \leq Sb$ and $\{V^2/(2\alpha)\} \leq Sa$

Figure 11:
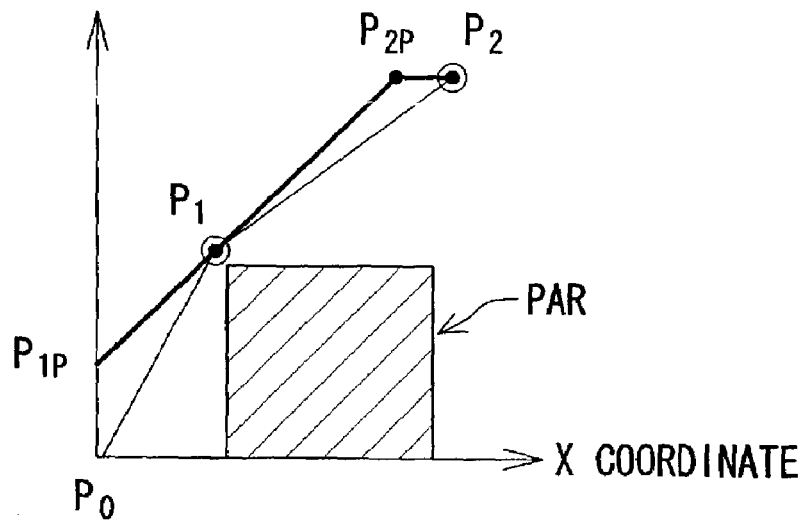
FIG. 11 is a view showing a positional relationship between the original position $P_0$, the operational passing position $P_1$, the target position $P_2$, and the passing avoidance region in a first case in the electronic component mounting apparatus of FIG. 1.
Figure 12:
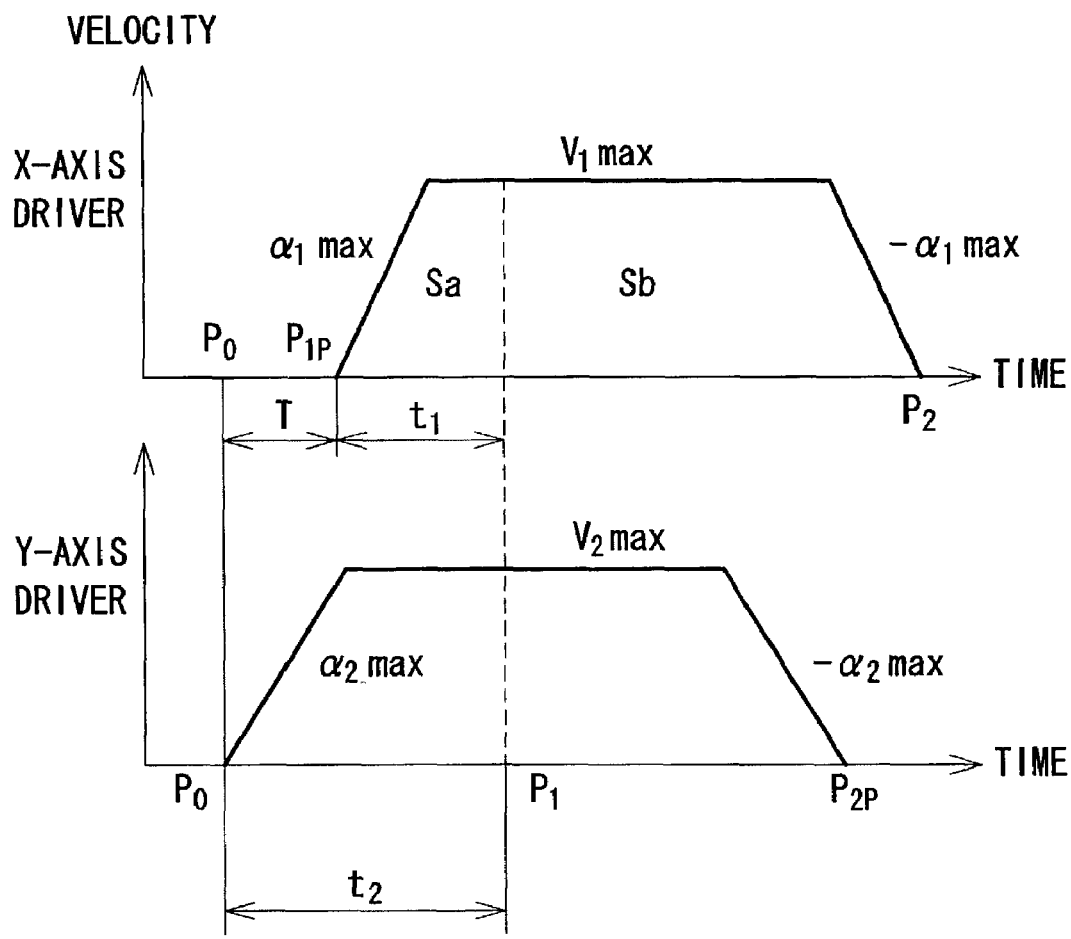
FIG. 12 is a view showing a change pattern of a moving velocity of the transfer head under the positional relationship shown in FIG. 11.

The first case is for performing positioning control with a velocity change pattern shown in FIG. 12 when an original position $P_0$, an operational passing position $P_1$, a target position $P_2$, and a passing avoidance region PAR of the transfer head 28 are under a positional relationship shown, for example, in FIG. 11. More particularly, this is a case where the transfer head 28 passes the operational passing position $P_1$ located before a middle point of a total travel distance and after completion of acceleration.

As shown in FIG. 11, a change pattern of a moving velocity of the transfer head 28 along the Y axis in this case is that at a time of an output of an operational start command, acceleration is given with the maximum acceleration $\alpha_{max}$, the operational passing position $P_1$ is passed at the maximum velocity $V_{max}$ in a state where the transfer head 28 reaches the maximum velocity $V_{max}$, deceleration is given before an operational end position $P_{2P}$, and termination is made in the position of $P_{2P}$. A change pattern along the X axis is that acceleration is given with the maximum acceleration $\alpha_{max}$ after a lapse of operation start delay time T from the output of the operational start command, the operational passing position $P_1$ is passed at the maximum velocity $V_{max}$ in a state where the transfer head reaches the maximum velocity $V_{max}$, deceleration is given before the target position $P_2$, and termination is made in the position of $P_{2P}$. It is noted that the acceleration at the time of deceleration is $-\alpha_{max}$ and the operational start delay time T is given by $|t_1-t_2|$.

Description will now be made of equation (1) shown in FIG. 9.

Figure 13:
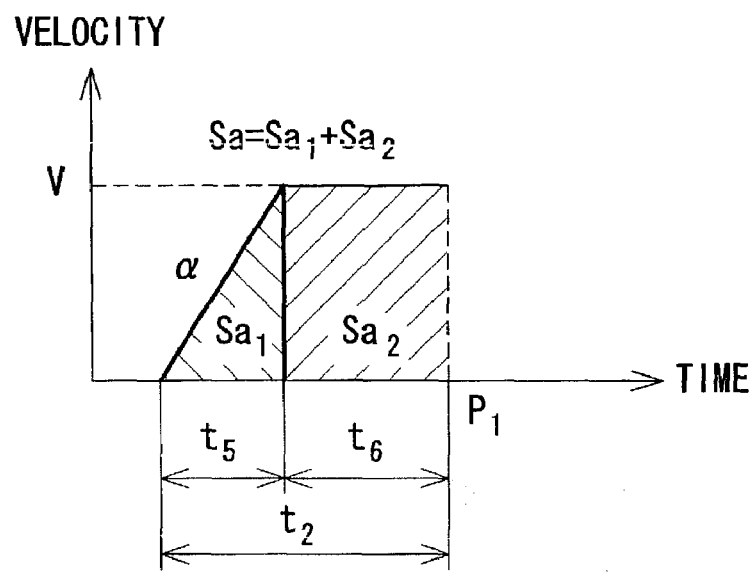
FIG. 13 is a partial enlarged view showing the velocity change pattern within the necessary time $t_2$ along the Y axis of FIG. 12.

FIG. 13 is a partial enlarged view showing a velocity change pattern within a necessary time $t_2$ along the Y axis of FIG. 12. For obtaining the necessary time $t_1$, $t_2$ is considered to be divided into time in a period of acceleration $t_5$ and time in a period of constant velocity $t_6$. A travel distance in the period of acceleration is expressed as Sa1, and a travel distance in the period of constant velocity is expressed as Sa2.

First, the travel distance Sa1 in the period of acceleration is expressed as $(V/2)t_5$, and also expressed as $Sa1=V^2/2\alpha$ from a relationship of $V=\alpha t_5$. The travel distance Sa2 in the period of constant velocity is expressed as $V \times t_6$, and also expressed as $Sa2=Sa-(V^2/2\alpha)$ as it is a value obtained by subtracting Sa1 from the travel distance Sa.

From the above relationship, time $t_5$ is obtained from the travel distance Sa1, and time $t_6$ is obtained from the travel distance Sa2, from which necessary time t2, that is, t5+t6 is obtained as shown below:

$$t=V/\alpha+[Sa-V^2/(2\alpha)]/V \qquad (1)$$

where $t=t_2$

The necessary time $t_1$ along the X axis of FIG. 11 can be also similarly obtained by equation (1).

Second case: $Sa \leq Sb$ and $V^2/(2\alpha) > Sa$

Figure 14:
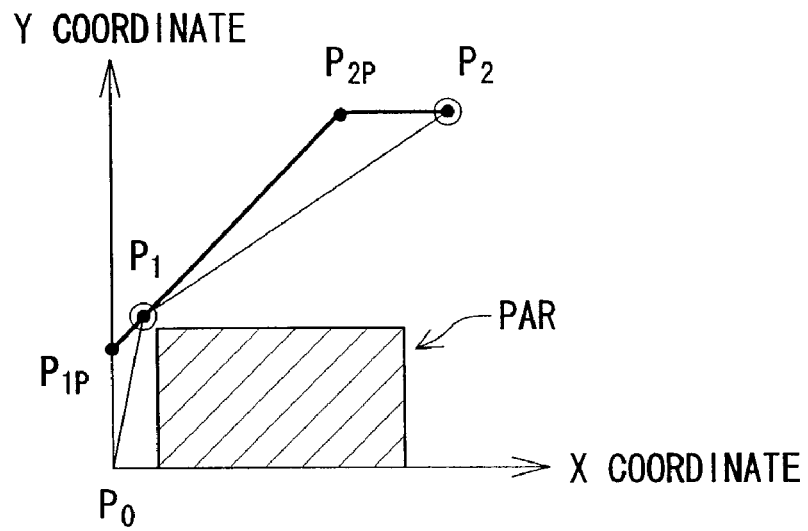
FIG. 14 is a view showing a positional relationship between the original position $P_0$, the operational passing position $P_1$, the target position $P_2$, and the passing avoidance region in a second case in the electronic component mounting apparatus of FIG. 1.

The second case is for performing positioning control with a velocity change pattern shown in FIG. 14 when an original position $P_0$, an operational passing position $P_1$, a target position $P_2$, and a passing avoidance region PAR of the transfer head 28 are under a positional relationship shown, for example, in FIG. 14. More particularly, this is a case where the transfer head 28 passes the operational passing position $P_1$ located before a middle point of a total travel distance and before completion of acceleration.

Figure 15:
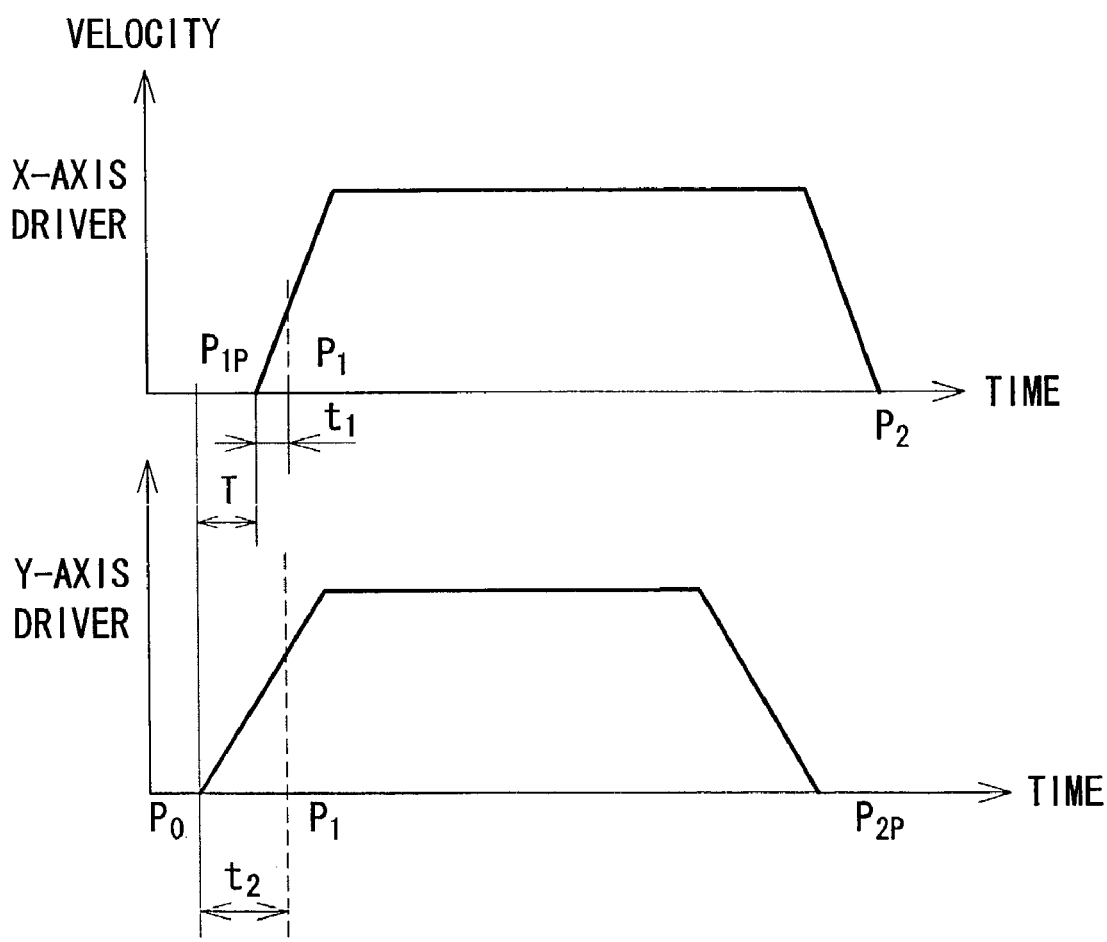
FIG. 15 is a view showing a change pattern of a moving velocity of the transfer head under the positional relationship shown in FIG. 14.

As shown in FIG. 15, a change pattern of a moving velocity of the transfer head 28 along the Y axis in this case is that at a time of an output of an operational start command, acceleration is given with maximum acceleration $\alpha_{max}$, the operational passing position $P_1$ is passed before maximum velocity $V_{max}$ is achieved, then, the maximum velocity $V_{max}$ is achieved, deceleration is given before an operational end position $P_{2P}$, and termination is made in the position of $P_{2P}$. A change pattern along the X axis is that acceleration is given with the maximum acceleration $\alpha_{max}$ after a lapse of operational start delay time T from the output of the operational start command, the operational passing position $P_1$ is passed before the maximum velocity $V_{max}$ is achieved, then, the maximum velocity $V_{max}$ is achieved, deceleration is given before the target position $P_2$, and termination is made in the position of $P_2$.

Description will now be made of equation (2) shown in FIG. 9.

Figure 16:
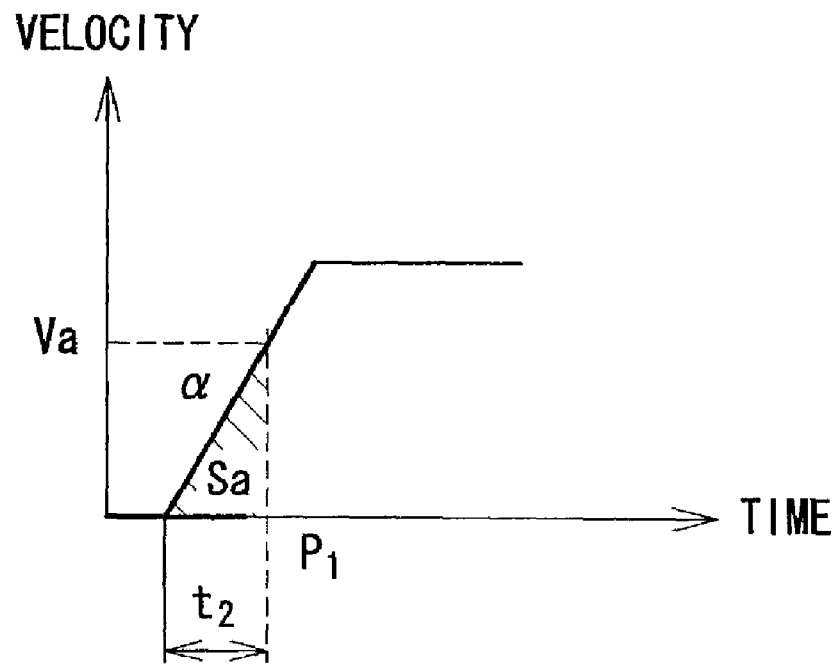
FIG. 16 a partial enlarged view showing the velocity change pattern within necessary time $t_2$ along the Y axis of FIG. 15.

FIG. 16 is a partial enlarged view showing a velocity change pattern within a necessary time $t_2$ along the Y axis of FIG. 15. As shown in FIG. 16, travel distance Sa in a period of acceleration is expressed as $(Va/2)t_2$. With the relationship of $Va=\alpha t_2$ introduced, it is expressed as $Sa=\alpha t_2^2/2$. From this equation, the time $t_2$ is obtained as shown below:

$$t=\sqrt{(2Sa/\alpha)} \qquad (2)$$

where $t=t_2$

Necessary time $t_1$ along the X axis of FIG. 15 is also similarly obtained by equation (2).

Third case: $Sa>Sb$ and $\{V^2/(2\alpha)\} \leq Sb$

Figure 17:
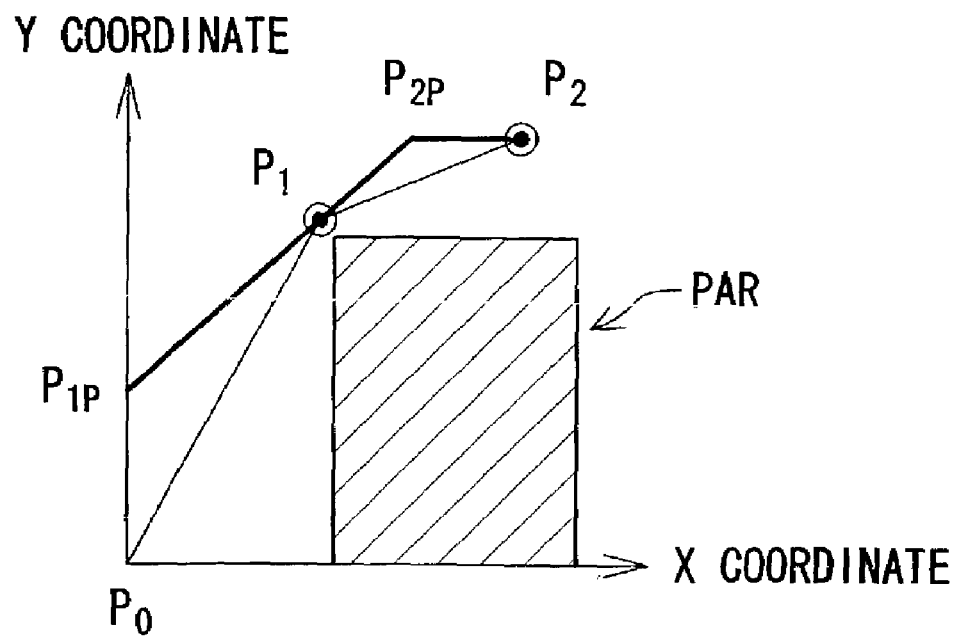
FIG. 17 is a view showing a positional relationship between the original position $P_0$, the operational passing position $P_1$, the target position $P_2$, and the passing avoidance region in a third case in the electronic component mounting apparatus of FIG. 1.
Figure 18:
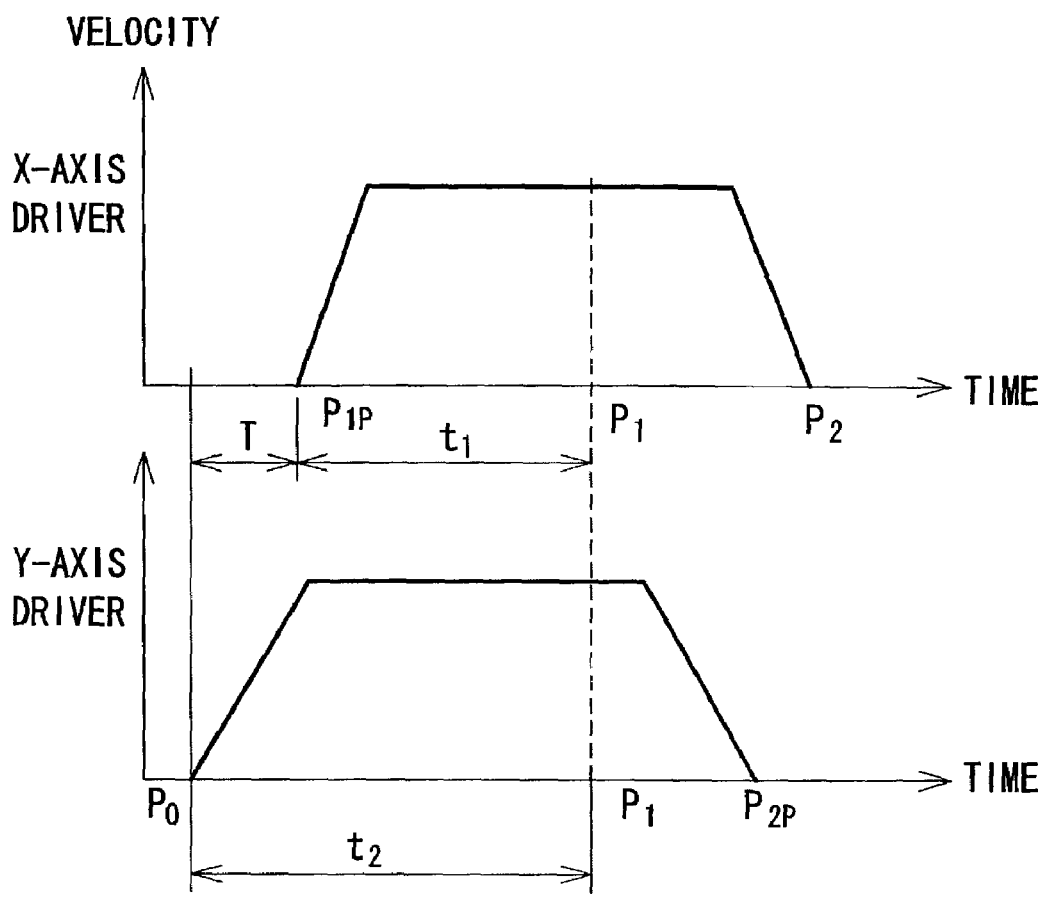
FIG. 18 is a view showing a change pattern of a moving velocity of the transfer head under the positional relationship shown in FIG. 17.

The third case is for performing positioning control with a velocity change pattern shown in FIG. 18 when an original position $P_0$, an operational passing position $P_1$, a target position $P_2$, and a passing avoidance region PAR of the transfer head 28 are under a positional relationship shown, for example, in FIG. 17. More particularly, this is a case where the transfer head 28 passes the operational passing position $P_1$ located after a middle point of a total travel distance and before start of deceleration.

As shown in FIG. 18, a change pattern of a moving velocity of the transfer head 28 along the Y axis in this case is that at a time of an output of an operational start command, acceleration is given with maximum acceleration $\alpha_{max}$, the operational passing position $P_1$ is passed at maximum velocity $V_{max}$ which has been achieved, deceleration is given before an operational end position $P_{2P}$, and termination is made in the position of $P_{2P}$. A change pattern along the X axis is that acceleration is given with the maximum acceleration $\alpha_{max}$ after a lapse of operational start delay time T from the output of the operational start command, the operational passing position $P_1$ is passed at the maximum velocity $V_{max}$ which has been achieved, deceleration is given before the target position $P_2$, and termination is made in the position of $P_2$.

Description will now be made of equation (3) shown in FIG. 9.

Figure 19:
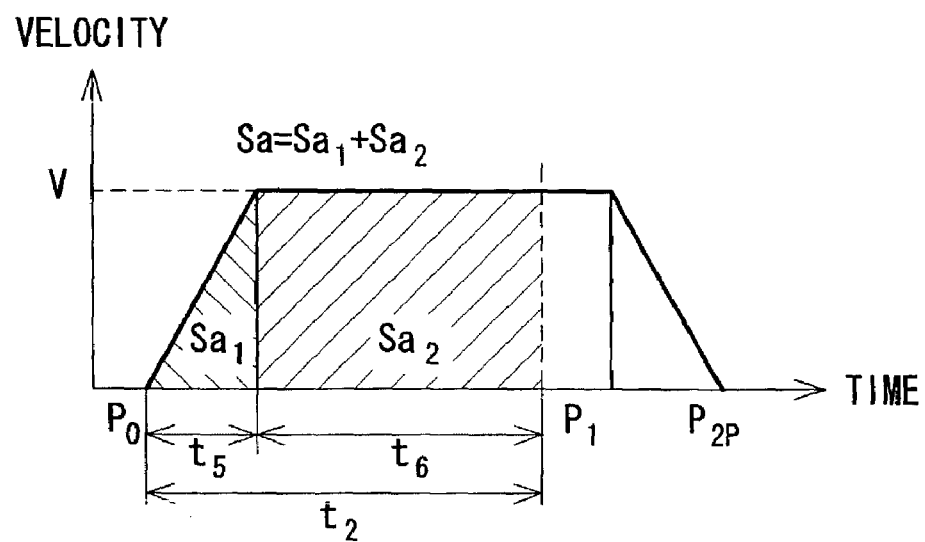
FIG. 19 is a view showing the velocity change pattern along the Y axis of FIG. 18.

FIG. 19 shows a velocity change pattern along the Y axis of FIG. 18. For obtaining necessary time $t_2$, $t_2$ is considered to be divided into time in a period of acceleration $t_5$ and time in a period of constant velocity $t_6$. A travel distance in the period of velocity is expressed as Sa1, and a travel distance in the period of constant acceleration is expressed as Sa2.

First, travel distance Sa1 in the period of acceleration is expressed as $(V/2)t_5$, and also expressed as $Sa1=V^2/2\alpha$ from the relationship of $V=\alpha t_5$. Travel distance Sa2 in the period of constant velocity is expressed as $V \times t_6$, and also expressed as $Sa2=Sa-(V^2/2\alpha)$ as it is a value obtained by subtracting Sa1 from travel distance Sa.

From the above relationship, the time $t_5$ is obtained from the travel distance Sa1, and the time $t_6$ is obtained from the travel distance Sa2, from which necessary time $t_2$, that is, $t_5+t_6$ is obtained as shown below:

$$t=V/\alpha+[Sa-V^2/(2\alpha)]/V \qquad (3)$$

where $t=t_2$

Necessary time $t_1$ along the X axis of FIG. 18 is also similarly obtained by equation (3).

Fourth case: $Sa>Sb$ and $\{V^2/(2\alpha)\}>Sb$ and $(V^2/\alpha)>S$ (where $S=Sa+Sb$)

Figure 20:
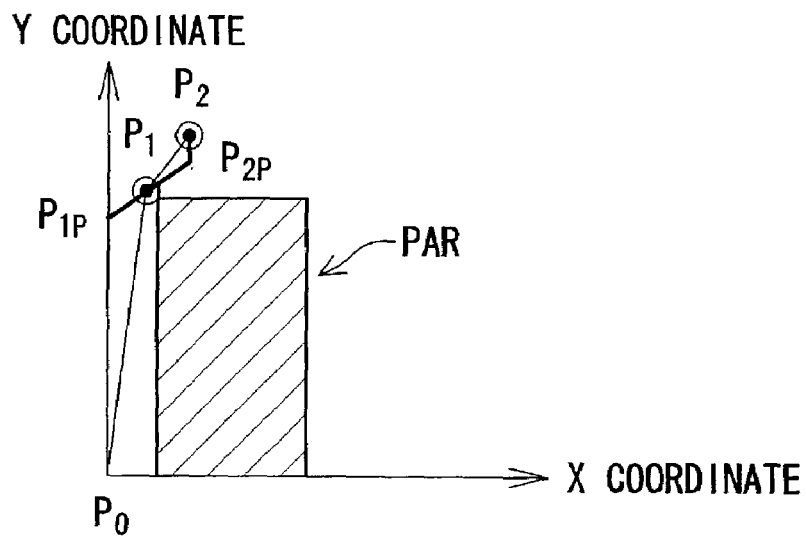
FIG. 20 is a view showing a positional relationship between the original position $P_0$, the operational passing position $P_1$, the target position $P_2$, and the passing avoidance region in fourth and fifth cases in the electronic component mounting apparatus of FIG. 1.
Figure 21:
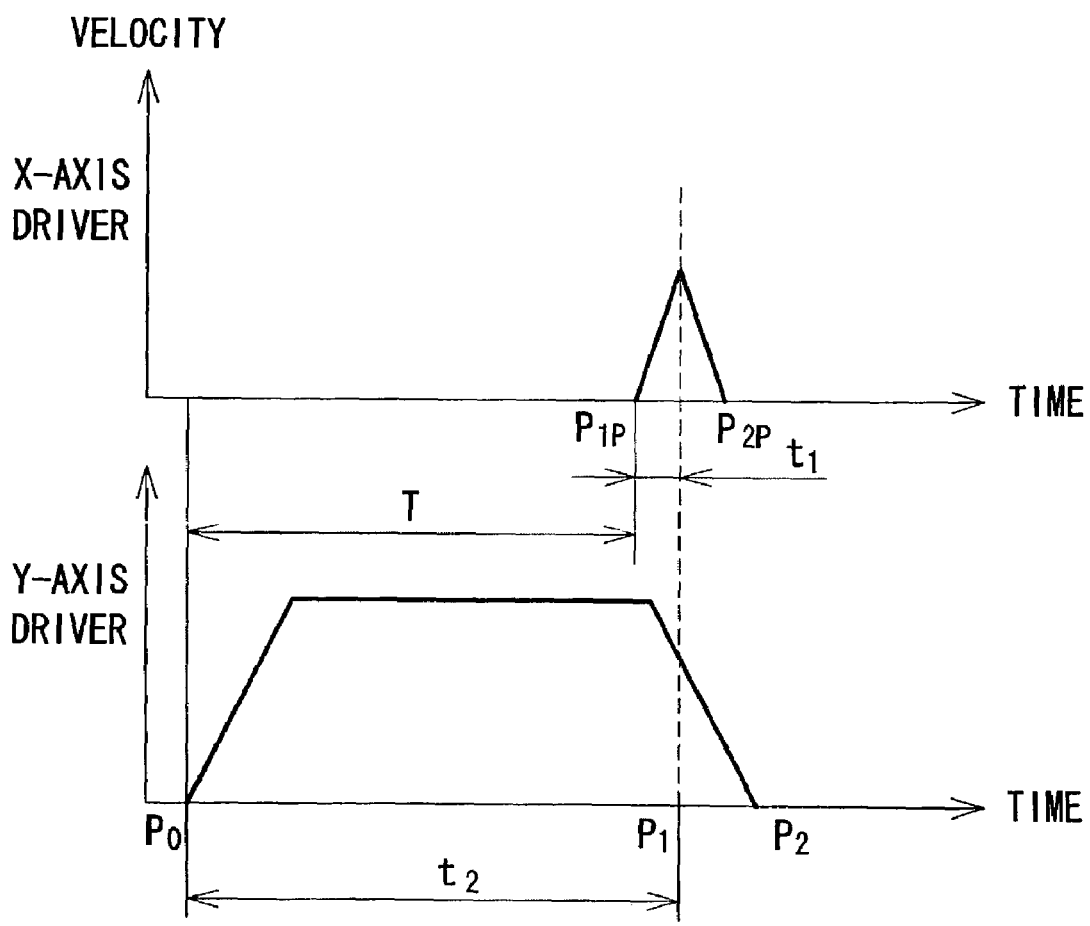
FIG. 21 is a view showing a change pattern of a moving velocity of the transfer head under the positional relationship shown in FIG. 20.

The fourth case is for performing positioning control with a velocity change pattern for X axis shown in FIG. 21 when an original position $P_0$, an operational passing position $P_1$, a target position $P_2$, and a passing avoidance region PAR of the transfer head 28 are under a positional relationship shown, for example, in FIG. 20. More particularly, this is a case where the transfer head 28 passes the operational passing position $P_1$ located after a middle point of the total travel distance at a decelerated velocity slower than a maximum velocity, and where it is necessary to drive with maximum acceleration at a time of driving start and to start deceleration before the maximum velocity is achieved.

As shown in FIG. 21, a change pattern of a moving velocity of the transfer head 28 along the X axis in this case is that acceleration is given with maximum acceleration $\alpha_{max}$ after a lapse of operational start delay time T from an output of the operational start command, the operational passing position $P_1$ is passed before the maximum velocity $V_{max}$ is achieved, deceleration is started at the time of passing the operational passing position $P_1$, and termination is made in the position of $P_{2P}$.

Description will now be made of equation (4) shown in FIG. 9.

Figure 22:
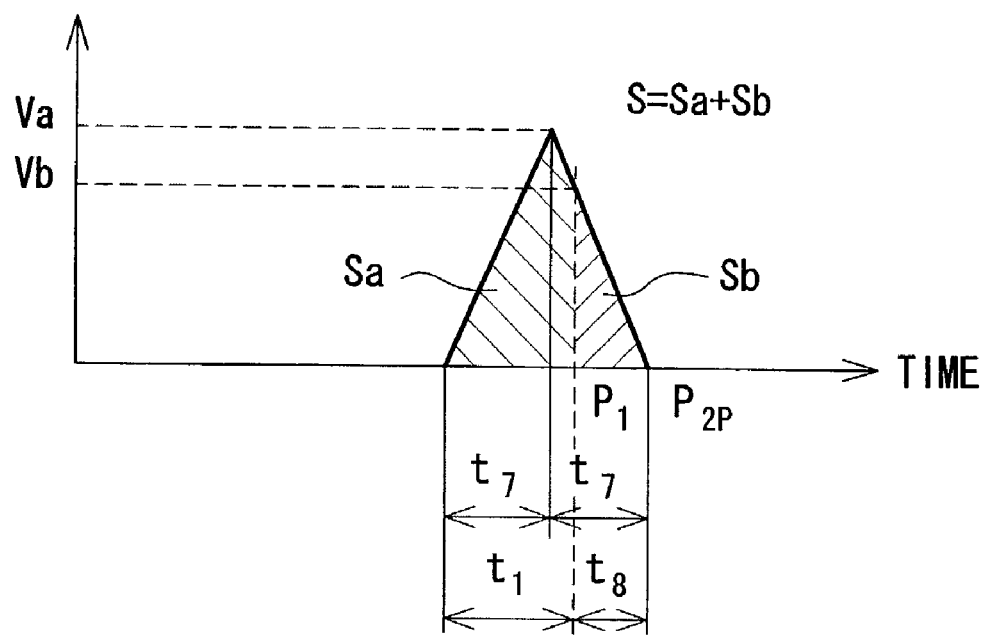
FIG. 22 is a view showing the velocity change pattern along the X axis of FIG. 21.

FIG. 22 is a view showing a velocity change pattern along the X axis of FIG. 21. For obtaining necessary time $t_1$, an acceleration period and a deceleration period are each expressed as $t_7$, and a time from the operational passing position $P_1$ to the operational end position $P_{2P}$ is expressed as $t_8$. Consequently, the necessary time $t_1$ is expressed as $2t_7-t_8$.

Here, the moving time $t_7$ is expressed as $t_7=\sqrt{(S/\alpha)}$ from the relationship of a total travel distance $S=Vat_7$ and $Va=\alpha t_7$. The moving time $T_8$ is expressed as $t_8=\sqrt{(2Sb/\alpha)}$ from the relationship of $Sb=Vbt_8/2$ and $Vb=\alpha t_8$.

Consequently, the necessary time $t_1$ is as shown below:

$$t=2\sqrt{(S/\alpha)}-\sqrt{(2Sb/\alpha)} \qquad (4)$$

where $t=t_1$

Fifth case: $Sa>Sb$ and $\{V^2/(2\alpha)\}>Sb$ and $(V^2/\alpha) \leq S$ (where $S=Sa+Sb$)

The fifth case is for performing positioning control with a velocity change pattern for Y axis shown in FIG. 21 when an original position $P_0$, an operational passing position $P_1$, a target position $P_2$, and a passing avoidance region PAR of the transfer head 28 are under a positional relationship shown in FIG. 20 similar to the fourth case. More particularly, this is the case where the transfer head 28 passes the operational passing position $P_1$ located after a middle point of a total travel distance at a decelerated velocity slower than a maximum velocity, and where driving with maximum acceleration is made at a time of driving start and deceleration is started after the maximum velocity is achieved.

As shown in FIG. 21, a change pattern of a moving velocity of the transfer head 28 along the Y axis in this case is that acceleration is given with maximum acceleration $\alpha_{max}$ at the time of an output of an operational start command, maximum velocity $V_{max}$ is achieved, then, the operational passing position $P_1$ is passed after deceleration is started, and termination is made in the position of $P_2$.

Description will now be made of equation (5) shown in FIG. 9.

Figure 23:
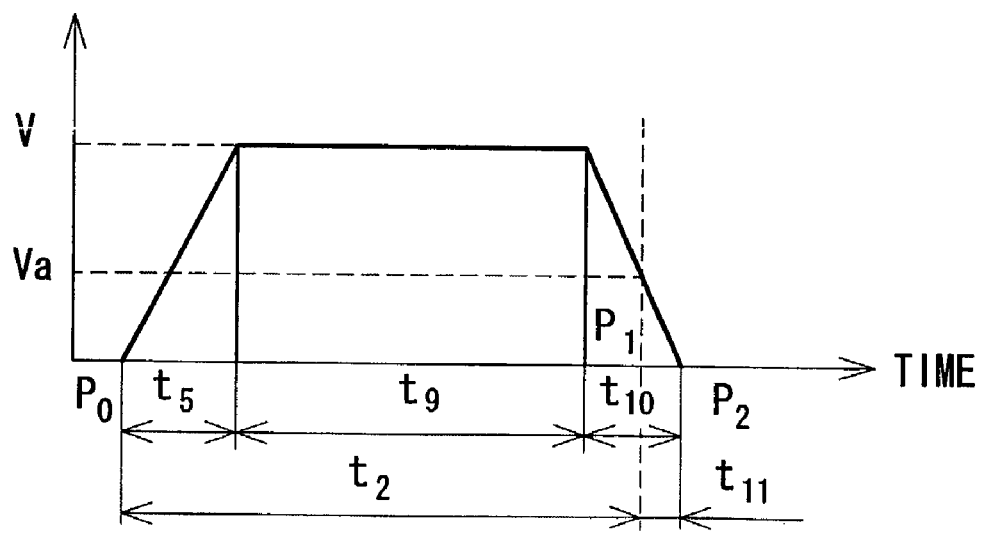
FIG. 23 is a view showing the velocity change pattern along the Y axis of FIG. 21.

FIG. 23 is a view showing a velocity change pattern along the Y axis of FIG. 21. For obtaining necessary time $t_2$, an acceleration period, a constant velocity period, and a deceleration period are each expressed as $t_5$, $t_9$, and $t_{10}$. A time from the operational passing position $P_1$ to the operational end position $P_2$ is expressed as $t_{11}$. Consequently, the necessary time $t_2$ is expressed as $t_5+t_9+t_{10}-t_{11}$.

Here, the moving time $t_5$ and $t_{10}$ are expressed as $V/\alpha$, and the moving time $t_9$ is expressed as $[S-\{V^2/(2\alpha)\}]/V$. The time $t_{11}$ is expressed as $t_{11}=\sqrt{(2Sb/\alpha)}$ from the relationship of $Sb=Vat_{11}/2$ and $Va=\alpha t_{11}$.

Consequently, the necessary time $t_2$ is as shown below:

$$t=2(V/\alpha)+[S-(V^2/\alpha)]/V-\sqrt{(2Sb/\alpha)} \quad (5)$$

where $t=t_2$

With use of any one of the above-described equations (1) to (5), there are obtained the necessary times $t_1$ and $t_2$, from which the driving start delay time $T(=|t_1-t_2|)$ may be obtained. Based on the driving start delay time T, the driving start time of the specification axis is delayed, so that the transfer head 28 can reach the target position with only one acceleration operation and only one deceleration operation performed both in X and Y directions, where the acceleration and deceleration operations are performed with maximum acceleration, and the transfer head 28 moves at maximum velocity during a constant velocity operation.

According to the positioning control method in the first embodiment disclosed above, by delaying the driving start time of an axis set as the specification axis for specifying delayed driving start for the driving start delay time T, that is a difference of the necessary times $t_1$ and $t_2$, timings of driving start and driving end are controlled, and it is so controlled that accelerated driving is made with the maximum acceleration to achieve maximum velocity after driving start, and the operational passing position $P_1$ can be passed at the maximum velocity (provided that in a case of a short travel distance, deceleration may be given before the maximum velocity is achieved). This makes it possible to shorten positioning time and to save power consumption. Consequently, the electronic component mounting apparatus 100 enables positioning and placement of electronic components, sucked by suction nozzle 34, in a placement position on the circuit board 12 in a short period of time, thereby increasing mounting efficiency and implementing tact up.

Following description will be given of a positioning control method according to a second embodiment of the present invention. Structure of a positioning control device for use in an electronic component mounting apparatus in the second embodiment is shown in block diagrams of FIGS. 24A and 24B.

In the positioning control device in the second embodiment shown in FIGS. 24A and 24B, component members having the same structure as the positioning control device in the first embodiment shown in FIGS. 4A and 4B are designated by the same reference numerals. Description thereof, therefore, will be omitted here. In the positioning control device of the second embodiment, a conversion table 7 that defines a relationship between a travel amount and a moving time is connected to a positioning controller 2 in a manner enabling input/output. The conversion table 7 facilitates driving of transfer head 28, and enables driving with an arbitrary velocity change pattern such as a sigmoid driving type as shown in FIG. 25, thereby implementing slow rising and falling, resulting in implementation of positioning with low vibration and noise.

The conversion table 7 is used, as shown in FIGS. 24A and 24B, for setting a velocity change pattern from driving start of the transfer head 28 to achievement of maximum velocity, and from the maximum velocity to driving end of the transfer head 28 to a sigmoid driving type or the like for each of X and Y axes robots 26, 22, and 24. More particularly, for facilitating driving control through simplification of operational processing for creation of driving signals, a travel amount and a moving time of the transfer head 28 during acceleration or deceleration with the velocity change pattern of the sigmoid driving type are stored in advance as a table, with proper reference to which driving with a desired velocity change pattern is easily implemented.

In the positioning control device in the second embodiment, referring to the conversion table 7 for calculating necessary time for a known travel distance to the operational passing position of the transfer head 28 makes it possible to clarify a relationship between the driving time of the transfer head 28 and the travel distance by the driving, thereby facilitating setting of a driving time for the travel distance.

Figure 25:
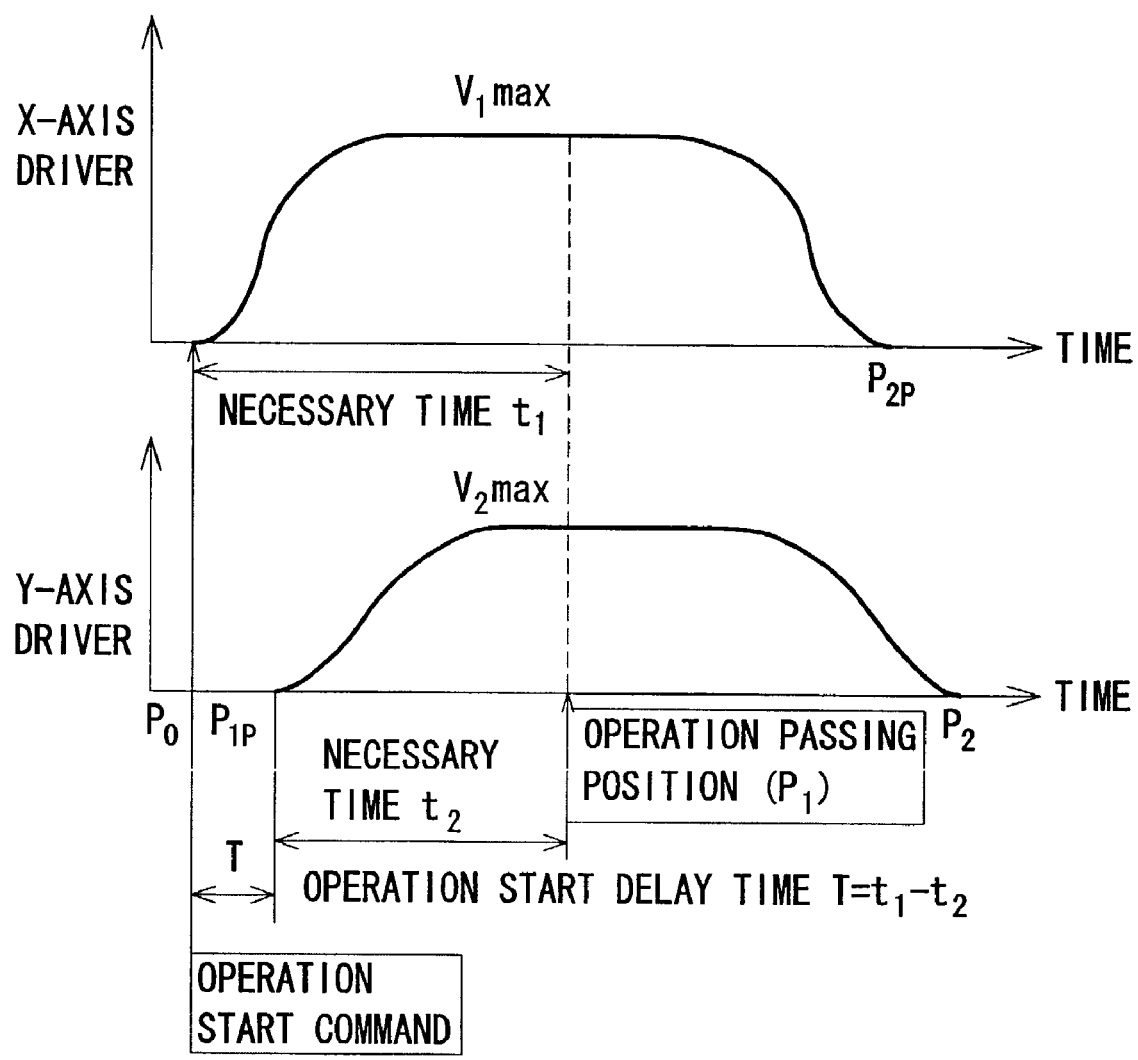
FIG. 25 is a view showing one example of change patterns of a moving velocity of the transfer head in the electronic component mounting apparatus in the second embodiment of the present embodiment.

Following description shows a specific positional relationship between the original position $P_0$, the operational passing position $P_1$, the target position $P_2$, and the passing avoidance region PAR of the transfer head 28, and a change pattern of a moving velocity of the transfer head 28 under such relationship as shown in FIG. 25, as well as a calculation method of driving start delay time T ($=|t_1-t_2|$) corresponding thereto, in each case based on the cases of the positioning control device according to the first embodiment.

FIG. 26 is a comprehensive view showing a calculation method of a necessary time t ($t_1$, $t_2$) for moving the transfer head 28 of the electronic component mounting apparatus from the original position $P_0$ to the operational passing position $P_1$ with an arbitrary acceleration curve in each expected case.

It is noted that in this figure, reference characters RaS and RaN denote an accelerated travel amount and acceleration time of the transfer head 28 obtained from the conversion table 7, and reference characters RdS and RdN denote a decelerated travel amount and deceleration time of the transfer head 28 obtained from the conversion table 7. Reference character Tbl [ ] denotes a value obtained from the conversion table 7.

Description will now be given of each case in sequence. Since each case is similar to the cases shown in FIG. 9, detailed description thereof will be omitted here.

First Case: Sa≦Sb and RaS≦Sa

Figure 27:
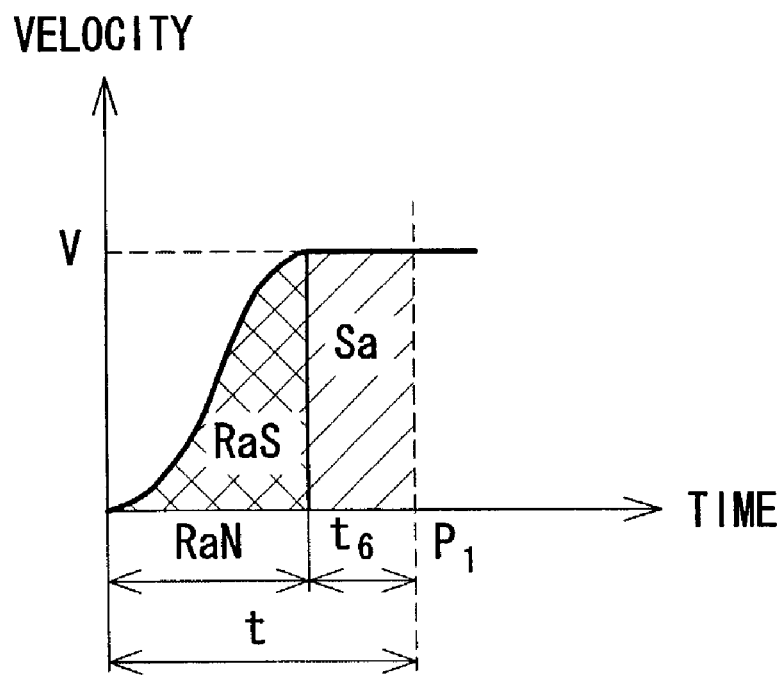
FIG. 27 is a view showing a change pattern of a moving velocity of the transfer head in a first case in the electronic component mounting apparatus according to the second embodiment.

A change pattern of a moving velocity of the transfer head 28 in this case is that a moving velocity of the transfer head 28 reaches maximum velocity $V_{max}$ at operational passing position $P_1$ as shown, for example, along only one axis in FIG. 27. A necessary time t from a driving start position to the operational passing position $P_1$ is obtained by $RaN+t_6$. With $t_6=(Sa-RaS)/V$, the necessary time t is expressed as shown below:

$$t=RaN+(Sa-RaS)/V \qquad (6)$$

Second case: $Sa \leq Sb$ and $RaS \leq Sa$

Figure 28:
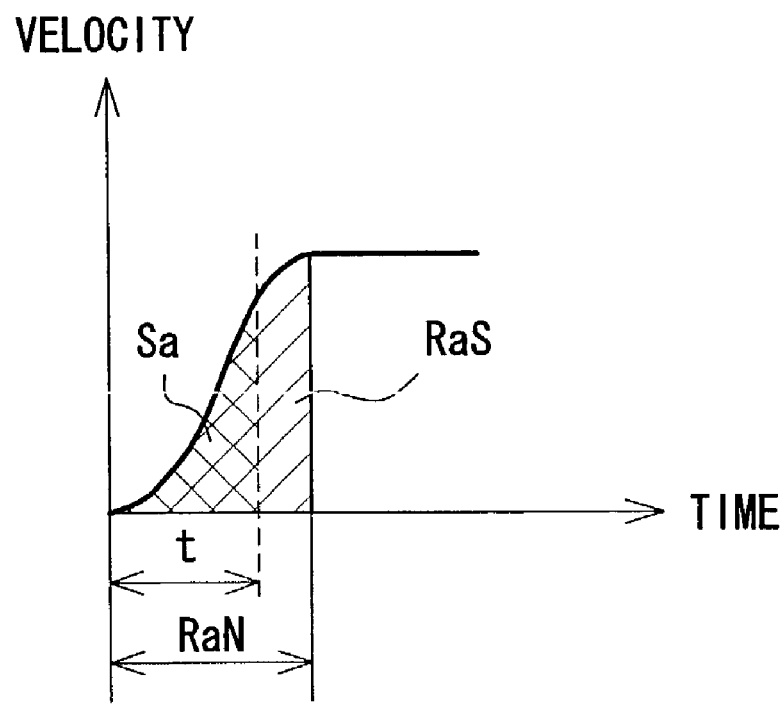
FIG. 28 is a view showing a change pattern of a moving velocity of the transfer head in a second case in the electronic component mounting apparatus according to the second embodiment.

A change pattern of a moving velocity of the transfer head 28 in this case is that for example, as shown in FIG. 28, the moving velocity of the transfer head 28 does not yet reach maximum velocity $V_{max}$ at operational passing position $P_1$. A necessary time t from a driving start position to the operational passing position $P_1$ is expressed as (Sa/RaS) times the acceleration time RaN, which is obtained with reference to the conversion table 7. Consequently the necessary time t is as shown below:

$$t=RaN \cdot Tb1[(Sa/RaS)] \qquad (7)$$

Obtaining an area ratio Sa/RaS on the graph of FIG. 28, i.e., a ratio of moving time to RaN from the ratio of a travel distance with reference to the conversion table 7 makes it possible to easily obtain the moving time in so-called sigmoid driving control without performing complicated processing such as integral processing.

Third case: $Sa>Sb$ and $RdS \leq Sb$

Figure 29:
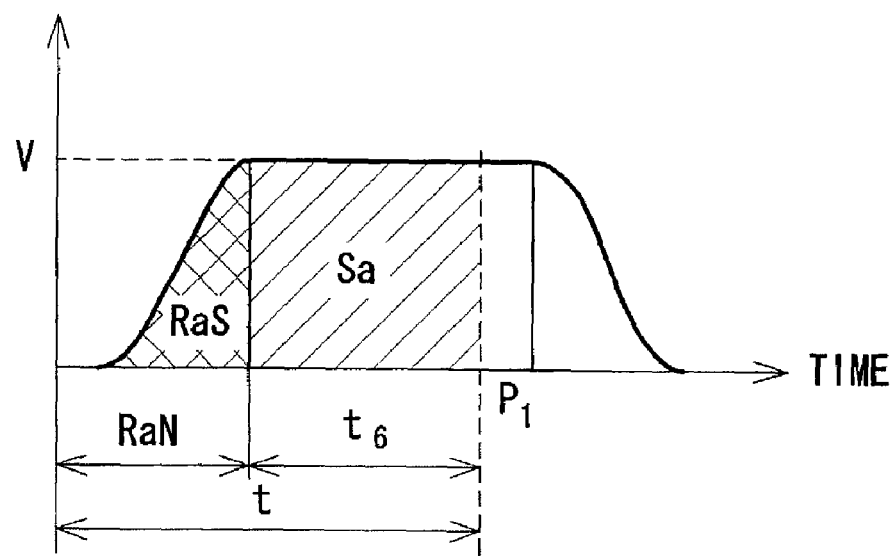
FIG. 29 is a view showing a change pattern of a moving velocity of the transfer head in a third case in the electronic component mounting apparatus according to the second embodiment.

A change pattern of a moving velocity of the transfer head 28 in this case is that as shown in FIG. 29, the moving velocity of the transfer head 28 equals maximum velocity $V_{max}$ at operational passing position $P_1$. A necessary time t from a driving start position to the operational passing position $P_1$ is obtained by $RaN+t_6$. As $t_6$ is $(Sa-RaS)/V$, the necessary time t is as shown below:

$$t=RaN+(Sa-RaS)/V \qquad (8)$$

Fourth case: $Sa>Sb$ and $RdS>Sb$ and $RaS+RdS>S$

Figure 30:
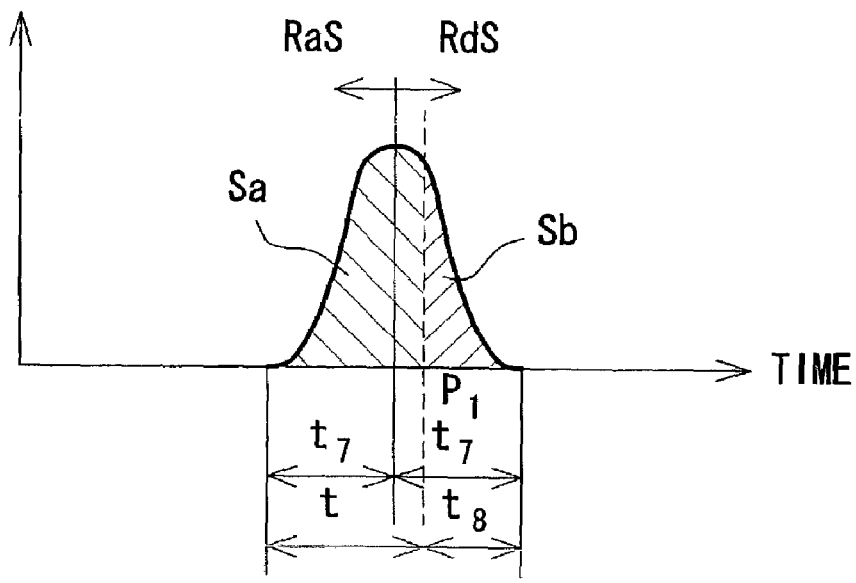
FIG. 30 is a view showing a change pattern of a velocity change of the transfer head in a fourth case in the electronic component mounting apparatus according to the second embodiment.

A change pattern of a moving velocity of the transfer head 28 in this case is that as shown in FIG. 30, deceleration is started before acceleration is made to maximum velocity, and the moving velocity of the transfer head 28 is in a state of deceleration at operational passing position $P_1$. A necessary time t from a driving start position to the operational passing position $P_1$ can be obtained by $2t_7-t_8$. Here, the value $t_7$ is Sa/(RaS+RdS) times the time corresponding to the sum of RaN and RdN, and the value $t_8$ is Sb/RdS times the time corresponding to RdN. Consequently, if these values are obtained with reference to the conversion table 7, the necessary time t is expressed as shown below:

$$t = (RaN + RdN) \cdot Tbl[Sa/(RaS+RdS)] - RdN \cdot Tbl[Sb/(RdS)] \qquad (9)$$

Fifth case: $Sa>Sb$ and $RdS>Sb$ and $RaS+RdS \leq S$

Figure 31:
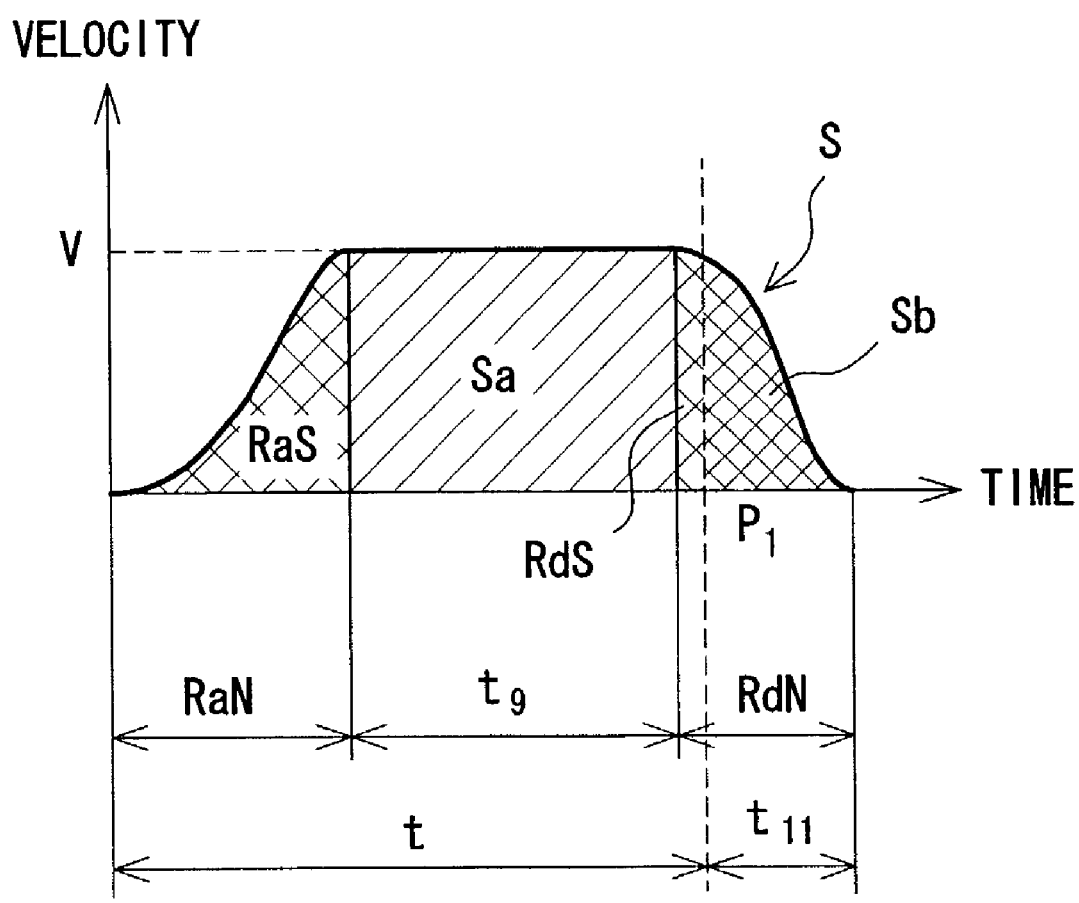
FIG. 31 is a view showing a change pattern of a velocity change of the transfer head in a fifth case in the electronic component mounting apparatus according to the second embodiment.
Figure 32:
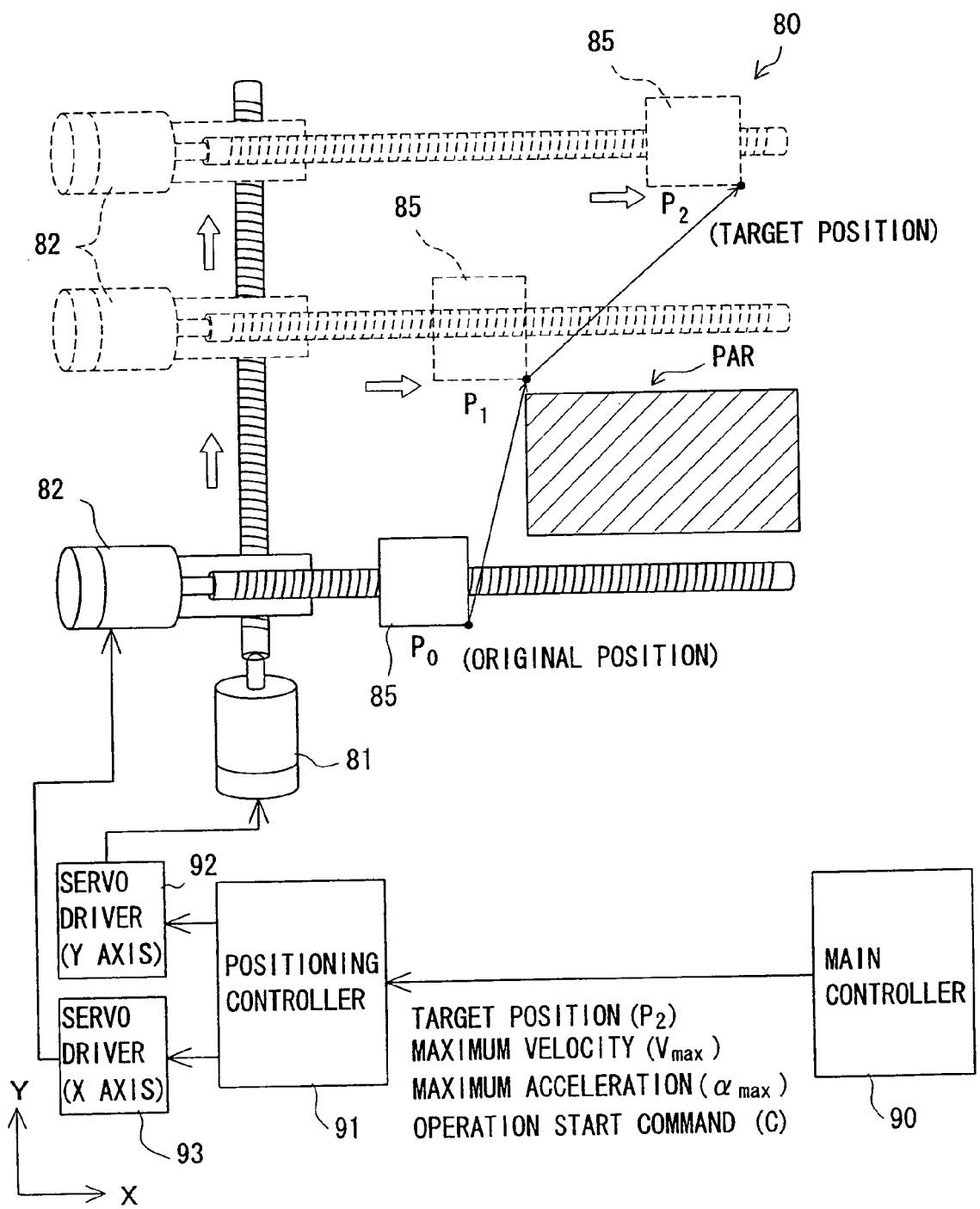
FIG. 32 is a view showing structure of a drive mechanism of a transfer head of a conventional electronic component mounting apparatus.
Figure 33:
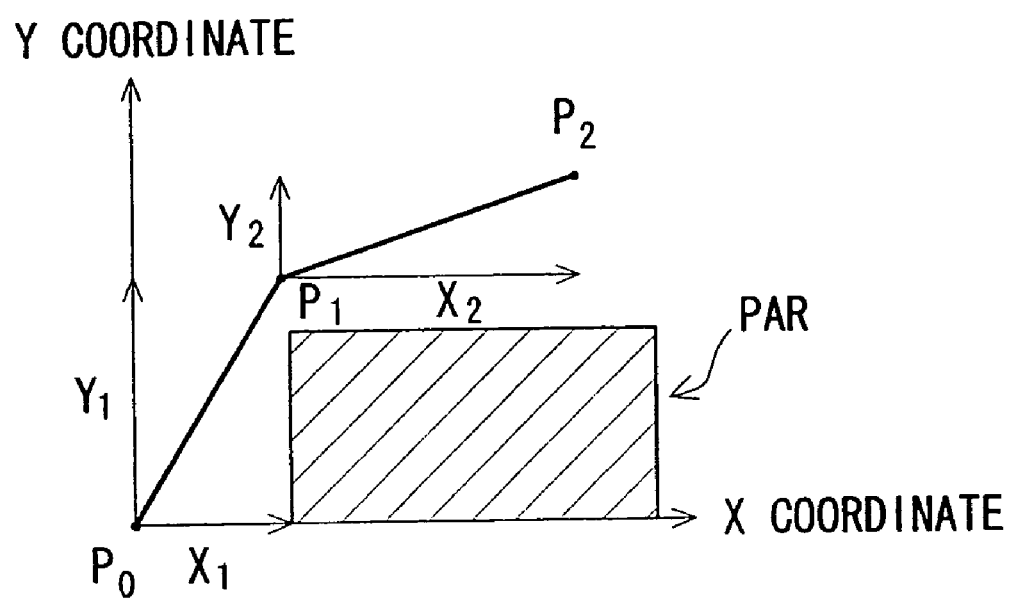
FIG. 33 is a schematic view showing a positioning operation for avoiding a passing avoidance region in a conventional positioning control device.
Figure 34:
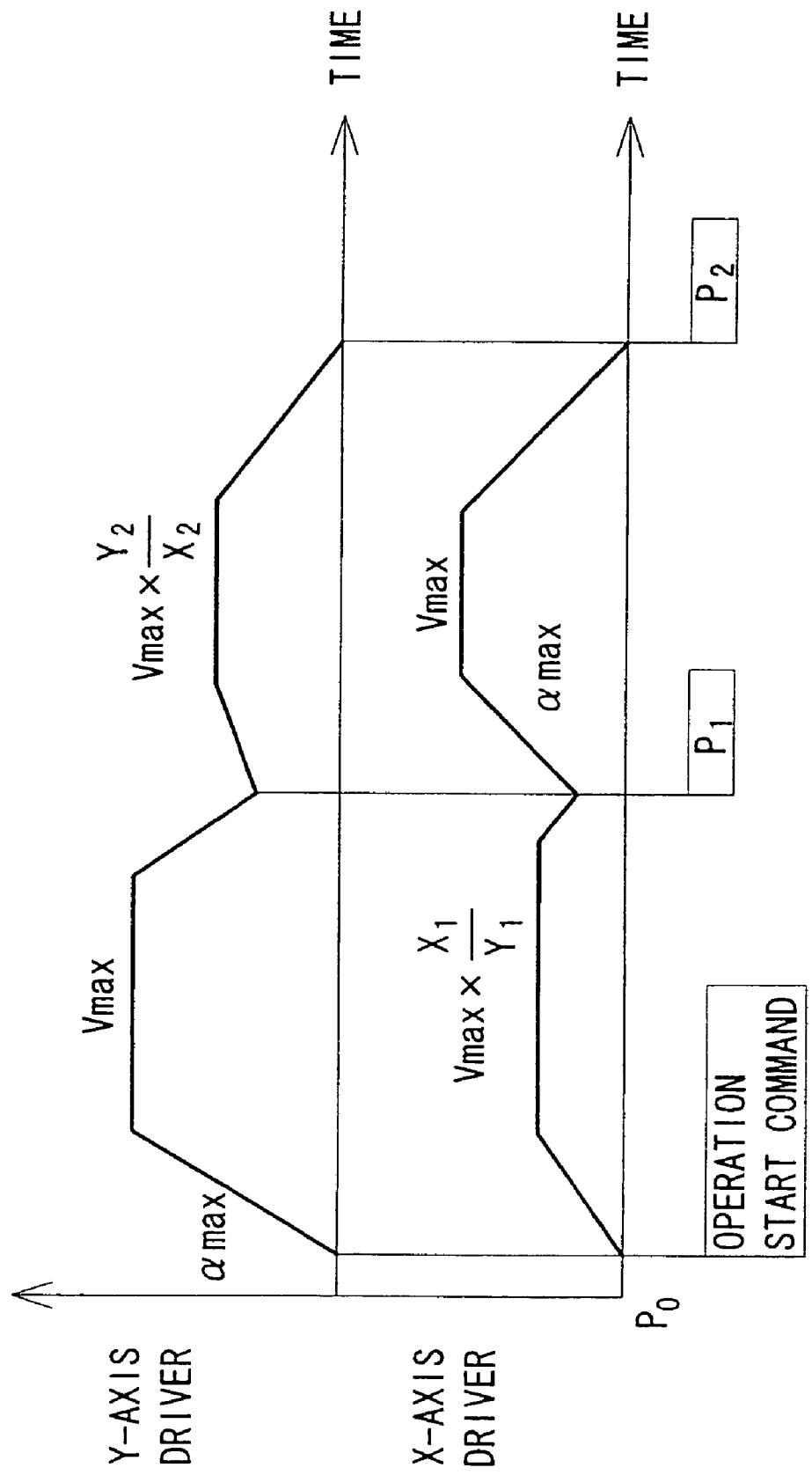
FIG. 34 is a view showing a driving pattern of the transfer head in the case shown in FIG. 33.

A change pattern of a moving velocity of the transfer head 28 in this case is that as shown in FIG. 31, the moving velocity of the transfer head 28 is in a state of deceleration at operational passing position $P_1$. A necessary time t from a driving start position to the operational passing position $P_1$ is obtained by $RaN+t_9+RdN-t_{11}$ where $t_9=(S-RaS-RdS)/V$. As the value $t_{11}$ is Sb/RdS times the time corresponding to RdN, the value is obtained with reference to the conversion table 7. Consequently, the necessary time t is as shown below:

$$t = RaN + RdN + (S - RaS - RdS)/V - RdN \cdot Tbl\ [Sb/(RdS)] \qquad (10)$$

As described above in detail, according to the positioning control device of the electronic component mounting apparatus in the second embodiment, by delaying the driving start timing of an axis set as the specification axis for specifying delayed driving start for a difference of the necessary times $t_1$ and $t_2$, moving operation is performed based on a preset arbitrary velocity pattern after start of driving, which brings about considerable decrease of vibration at the time of acceleration, and implements power savings due to shortened positioning time. Consequently, the electronic component mounting apparatus in the second embodiment enables positioning and placing of electronic components sucked by suction nozzle 34 in a placing position on the circuit board 12 for a short period of time.

Although in each of the above embodiments, description is made by taking a case of two-axle control, the present invention may also be applied to a case with three axes or more.

In the positioning control method and the positioning control device of the present invention, driving start timing of a drive unit having a smaller travel distance from an original position of a movable body to a coordinate of an operational passing position is delayed by a specified period of time from driving start time of a drive unit having a longer travel distance from the original position to another coordinate of the operational passing position, which enables passing of the movable body through the operational passing position, set for avoiding a passing avoidance region PAR at maximum velocity. This implements high speed positioning control with low power consumption.

Furthermore, in the electronic component mounting apparatus of the present invention, there is performed driving control by a driving control device so that an operational passing position set for avoiding a passing avoidance region PAR is passed at maximum velocity without performing acceleration and deceleration operations, which enables high speed positioning with low power consumption. This enables positioning and placement of electronic components, sucked by suction nozzles 34, in a placement position on the circuit board 12 in a short period of time, resulting in increased mounting efficiency of components.

It will be understood that the present invention is not limited to the embodiments disclosed, but may be practiced in still other ways. For instance, the present invention is applied not only to a moving operation of the transfer head 28 from sucking to placement positions, but also to a case of moving the transfer head 28 to a sucking position for sucking a next electronic component after one electronic component is placed onto a placement position of the circuit board 12.

It will be understood that appropriate combination of arbitrary embodiments among the above stated various embodiments may implement effects peculiar to each embodiment.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method for controlling movement of a body from an original position to a target position by individually operating two drive units for moving the body, in directions orthogonal to each other, along an X axis and along a Y axis while avoiding passing of the body through a passing avoidance region, comprising:
setting, as an operational passing position, a passing point in a travel route of the body for avoiding the passing avoidance region; and
controlling operation of the drive units such that operation of one of the drive units, associated with a shorter travel distance from the original position to one of an X-axis coordinate and a Y-axis coordinate of said operational passing position, is started later than operation of the other of the drive units, associated with a longer travel distance from the original position to the other of said X-axis coordinate and said Y-axis coordinate of said operational passing position.

2. The method according to claim 1, further comprising:
calculating a first necessary driving time for said shorter travel distance and a second necessary driving time for said longer travel distance,
wherein controlling operation of the drive units such that operation of said one of the drive units is started later than operation of said other of the drive units comprises controlling operation of the drive units based on the first necessary driving time as calculated and the second necessary driving time as calculated.

3. The method according to claim 2, wherein
controlling operation of the drive units based on the first necessary driving time as calculated and the second necessary driving time as calculated comprises controlling operation of the drive units based on a calculated difference between said first and second necessary driving times.

4. The method according to claim 3, further comprising:
controlling operation of the drive units such that said one and said other of the drive units each perform only one acceleration operation and only one deceleration operation between the original position and the target position.

5. The method according to claim 2, further comprising:
controlling operation of the drive units such that said one and said other of the drive units each perform only one acceleration operation and only one deceleration operation between the original position and the target position.

6. The method according to claim 1, further comprising:
controlling operation of the drive units such that said one and said other of the drive units each perform only one acceleration operation and only one deceleration operation between the original position and the target position.

7. The method according to claim 6, wherein
controlling operation of the drive units such that said one and said other of the drive units each perform only one acceleration operation and only one deceleration operation comprises controlling operation of the drive units such that said one and said other of the drive units each perform a respective acceleration operation with constant acceleration and perform a respective deceleration operation with constant deceleration.

8. The method according to claim 7, further comprising:
controlling operation of the drive units such that when the body passes said operational passing position, said one and said other of the drive units operate for moving the body at a maximum velocity.

9. The method according to claim 7, further comprising:
controlling operation of the drive units such that when the body passes said operational passing position, said one and said other of the drive units operate to perform respective acceleration and deceleration operations.

10. The method according to claim 6, wherein
controlling operation of the drive units such that said one and said other of the drive units each perform only one acceleration operation and only one deceleration operation comprises controlling operation of the drive units such that said one and said other of the drive units each perform respective acceleration and deceleration operations based on a preset velocity change pattern.

11. The method according to claim 10, further comprising:
setting a velocity of said respective acceleration and deceleration operations, based on said velocity change pattern, with reference to a conversion table that defines a relationship between a driving time and a travel amount within the driving time.

12. The method according to claim 10, further comprising:
setting a necessary time for said one and said other of the drive units to drive the body from the original position to said operational passing position, based on said velocity change pattern, with reference to a conversion table that defines a relationship between a travel amount and a driving time.

13. The method according to claim 6, wherein
controlling operation of the drive units such that said one and said other of the drive units each perform only one acceleration operation and only one deceleration operation comprises controlling operation of the drive units such that said one and said other of the drive units each perform respective acceleration and deceleration operations based on a preset velocity change pattern including a curvilinear velocity change.

14. The method according to claim 13, further comprising:
setting a velocity of said respective acceleration and deceleration operations, based on said velocity change pattern, with reference to a conversion table that defines a relationship between a driving time and a travel amount within the driving time.

15. The method according to claim 13, further comprising:
setting a necessary time for said one and said other of the drive units to drive the body, from the original position to said operational passing position, based on said velocity change pattern, with reference to a conversion table that defines a relationship between a travel amount and a driving time.

16. The method according to claim 13, further comprising:
controlling operation of the drive units such that when the body passes said operational passing position, said one and said other of the drive units operate for moving the body at a maximum velocity.

17. The method according to claim 13, further comprising:
controlling operation of the drive units such that when the body passes said operational passing position, said one and said other of the drive units operate to perform respective acceleration and deceleration operations.

18. A device for controlling movement of a body from an original position to a target position by individually operating two drive units for moving the body, in directions orthogonal to each other, along an X axis and along a Y axis while avoiding passing of the body through a passing avoidance region, comprising:
- a setting section for setting, as an operational passing position, a passing point in a travel route of the body for avoiding the passing avoidance region; and
- a command section for outputting a command for controlling operation of the drive units such that operation of one of the drive units, associated with a shorter travel distance from the original position to one of an X-axis coordinate and a Y-axis coordinate of the operational passing position, is started later than operation of the other of the drive units, associated with a longer travel distance from the original position to the other of the X-axis coordinate and the Y-axis coordinate of the operational passing position.

19. The device according to claim 18, further comprising:
- a calculation section for calculating a first necessary driving time for the shorter travel distance and a second necessary driving time for the longer travel distance,
- wherein said command section is for controlling operation of the drive units such that operation of said one of the drive units is started later than operation of said other of the drive units by controlling operation of the drive units based on the first necessary driving time as calculated and the second necessary driving time as calculated.

20. A component mounting apparatus, comprising:
- a component feed unit for feeding components;
- a transfer head for placing a component fed from said component feed unit onto a circuit board;
- two drive units for moving said transfer head; and
- a control device for controlling movement of said transfer head from an original position to a target position by individually operating said drive units for moving said transfer head, in directions orthogonal to each other, along an X axis and along a Y axis while avoiding passing of said transfer head through a passing avoidance region, said control device including
- (i) a setting section for setting, as an operational passing position, a passing point in a travel route of the body for avoiding the passing avoidance region, and
- (ii) a command section for outputting a command for controlling operation of the drive units such that operation of one of the drive units, associated with a shorter travel distance from the original position to one of an X-axis coordinate and a Y-axis coordinate of the operational passing position, is started later than operation of the other of the drive units, associated with a longer travel distance from the original position to the other of the X-axis coordinate and the Y-axis coordinate of the operational passing position.

21. The component mounting apparatus according to claim 20, wherein said control device further comprises:
- a calculation section for calculating a first necessary driving time for the shorter travel distance and a second necessary driving time for the longer travel distance,
- with said command section being for controlling operation of the drive units such that operation of said one of the drive units is started later than operation of said other of the drive units by controlling operation of the drive units based on the first necessary driving time as calculated and the second necessary driving time as calculated.

* * * * *